United States Patent
Nakamura et al.

(10) Patent No.: US 8,536,763 B2
(45) Date of Patent: Sep. 17, 2013

(54) ULTRASONIC TRANSDUCER, ULTRASONIC SENSOR, METHOD OF MANUFACTURING ULTRASONIC TRANSDUCER, AND METHOD OF MANUFACTURING ULTRASONIC SENSOR

(75) Inventors: Tomoaki Nakamura, Chino (JP); Tsutomu Nishiwaki, Azumino (JP)

(73) Assignee: Seiko Epson Corporation (JP)

( * ) Notice: Subject to any disclaimer, the term of this patent is extended or adjusted under 35 U.S.C. 154(b) by 317 days.

(21) Appl. No.: 12/946,061

(22) Filed: Nov. 15, 2010

(65) Prior Publication Data
US 2011/0115337 A1    May 19, 2011

(30) Foreign Application Priority Data

Nov. 16, 2009 (JP) .................................. 2009-260679
Aug. 17, 2010 (JP) .................................. 2010-182113

(51) Int. Cl.
*H01L 41/09* (2006.01)
(52) U.S. Cl.
CPC .................................. *H01L 41/0926* (2013.01)
USPC .......................................... 310/324; 310/322
(58) Field of Classification Search
CPC .................................................. H01L 41/0926
USPC .................................. 310/322, 324, 334, 335
See application file for complete search history.

(56) References Cited

U.S. PATENT DOCUMENTS

| 4,597,099 A * | 6/1986 | Sawafuji ........................ 381/190 |
| 6,894,425 B1 * | 5/2005 | Solomon et al. ............... 310/334 |
| 2008/0116765 A1 * | 5/2008 | Sugiura et al. ................. 310/334 |

FOREIGN PATENT DOCUMENTS

JP      2006-319945      11/2006

* cited by examiner

*Primary Examiner* — Derek Rosenau
(74) *Attorney, Agent, or Firm* — Harness, Dickey & Pierce, P.L.C.

(57) ABSTRACT

An ultrasonic transducer includes: a support member having an opening section; a diaphragm adapted to cover the opening section; and a piezoelectric member provided to the diaphragm and at least one of expanding and contracting in an in-plane direction in response to application of a voltage, wherein the diaphragm has a concave groove section formed to have a concave shape on a surface on an opposite side to one side exposed to the opening section, and the piezoelectric member is fixed to the diaphragm in an area outside the concave groove section, and disposed to cover the concave groove section so as to be opposed to a bottom of the concave groove section via a space.

6 Claims, 17 Drawing Sheets

US 8,536,763 B2

ULTRASONIC TRANSDUCER, ULTRASONIC SENSOR, METHOD OF MANUFACTURING ULTRASONIC TRANSDUCER, AND METHOD OF MANUFACTURING ULTRASONIC SENSOR

BACKGROUND

1. Technical Field

The present invention relates to an ultrasonic transducer for converting a voltage signal into an ultrasonic wave, an ultrasonic sensor, a method of manufacturing an ultrasonic transducer, and a method of manufacturing an ultrasonic sensor.

2. Related Art

In the past, there has been known micro electromechanical systems (MEMS) provided with ultrasonic transducers for outputting ultrasonic waves. Since the ultrasonic transducers provided to such MEMS are formed to have extremely small sizes, and therefore have thin film piezoelectric members used as sources of ultrasonic waves, and are typically configured to output the ultrasonic waves by displacing diaphragms using vibration of the thin film piezoelectric members (see, e.g., JP-A-2006-319945 (Document 1)).

The diaphragm-type ultrasonic sensor element described in Document 1 is provided with a diaphragm having a multi-layer structure, and a PZT ceramic thin film layer provided to one side of the diaphragm and held between upper and lower electrodes. In such a diaphragm type ultrasonic sensor element, when applying a predetermined voltage to the PZT ceramic thin film layer through the upper and lower electrodes, the PZT ceramic thin film layer is elongated or contracted in an in-plane direction, and the diaphragm is distorted in a direction perpendicular to a surface direction in conjunction therewith to cause vibration, thereby outputting the ultrasonic wave.

Incidentally, in the element of Document 1 described above the amplitude of the vibration of the diaphragm corresponds to the amount of expansion or contraction of the PZT ceramic thin film layer in the in-plane direction, and is therefore not a large amount of displacement. Therefore, there arises a problem that the sound pressure of the ultrasonic wave is low.

SUMMARY

An advantage of some aspects of the invention is to provide an ultrasonic transducer capable of outputting an ultrasonic wave with high sound pressure even in the case of using a film-like piezoelectric member, an ultrasonic sensor equipped with the ultrasonic transducer, a method of manufacturing the ultrasonic transducer, and a method of manufacturing the ultrasonic sensor.

According to an aspect of the invention, there is provided an ultrasonic transducer including a support member having an opening section, a diaphragm adapted to cover the opening section, and a piezoelectric member provided to the diaphragm and at least one of expanding and contracting in an in-plane direction in response to application of a voltage, wherein the diaphragm has a concave groove section formed to have a concave shape on a surface on an opposite side to one side exposed to the opening section, and the piezoelectric member is fixed to the diaphragm in an area outside the concave groove section, and disposed to cover the concave groove section so as to be opposed to a bottom of the concave groove section via a space.

According to this aspect of the invention, the diaphragm is provided with the concave groove section, and a space is provided between the piezoelectric member and the diaphragm due to the concave groove section. Further, in the ultrasonic transducer, when a voltage is applied to the piezoelectric member to make the piezoelectric member contract in an in-plane direction, the inner circumferential wall surface of the end portion of the concave groove section in the diaphragm is displaced toward the inside of the concave groove section. Thus, the bottom of the concave groove section is displaced in a direction perpendicular to the in-plane direction of the diaphragm, and thus vibrates.

Here, in the configuration in the related art in which the piezoelectric member is stacked on the diaphragm, one surface of the piezoelectric member is formed to have close contact with the diaphragm, and therefore, when applying a voltage to the piezoelectric member, only the other side of the piezoelectric member not having close contact with the diaphragm is contracted, and thus the warpage is caused in the diaphragm to cause deflection to thereby output the ultrasonic wave. On this occasion, since the surfaces of the diaphragm and the piezoelectric element having close contact with each other causes resistance, the amount of contraction of the piezoelectric element is reduced, and the amount of deflection of the diaphragm is also reduced. Further, the amount of deflection of the piezoelectric member becomes directly the amount of deflection of the diaphragm, and therefore, if the amount of contraction of the piezoelectric member is small, the amount of contraction of the diaphragm becomes also small.

In contrast, according to the aspect of the invention, the diaphragm is provided with the concave groove section, and the piezoelectric member is formed so as to cover the concave groove section in the condition of providing the space between the bottom of the concave groove section and the piezoelectric member. In other words, the piezoelectric member is not fixed firmly to the diaphragm in the area opposed to the bottom of the concave groove section, but is fixed thereto in the outer peripheral end of the concave groove section. In such a configuration as described above, since the area opposed to the bottom of the concave groove section does not have close contact with the diaphragm, the piezoelectric member contracts in the in-plane direction, thus the wall portion of the concave groove section is pulled toward the inside of the concave groove section, and the bottom of the concave groove section is deflected in the direction perpendicular to the in-plane direction of the diaphragm to thereby output the ultrasonic wave. On this occasion, since the area of the piezoelectric member opposed to the concave groove section does not have close contact with the diaphragm, the resistance in the contraction is small, and the amount of contraction of the piezoelectric member becomes large.

Further, according to the aspect of the invention, the inside wall of the outer circumferential end of the concave groove section is displaced as much as the dimension of the contraction amount of the piezoelectric member in the in-plane direction, and in conjunction therewith, the bottom of the concave groove section is deflected in the direction perpendicular to the in-plane direction of the diaphragm. In such a configuration, since the outer circumferential end itself of the concave groove section of the diaphragm is displaced toward the inside of the concave groove section, the amount of displacement of the bottom of the concave groove section also becomes large. In other words, even in the case in which the contraction amount of the piezoelectric member is small, the amount of displacement of the bottom of the concave groove section can be made large.

Therefore, according to the ultrasonic transducer of the aspect of the invention, the contraction amount of the piezoelectric member can be made larger, and the displacement amount of the bottom of the concave groove section with respect to the contraction amount of the piezoelectric member can also be made larger compared to the configuration of the related art in which one entire surface of the piezoelectric member is made to have close contact with the diaphragm, and therefore, it is possible to output the ultrasonic wave with higher sound pressure.

In the ultrasonic transducer according to the aspect of the invention, it is preferable that the piezoelectric member has at least one communicating section adapted to communicate the space and an external space with each other at a position opposed to the concave groove section.

Here, the communicating section can have any shapes providing the configuration thereof is capable of communicating the external space of the ultrasonic transducer and the space between the diaphragm and the piezoelectric member with each other, and for example, the communicating section can be a hole section provided to a part of the piezoelectric member, or a notch obtained by cutting a part of the outer periphery of the piezoelectric member.

According to the aspect of the invention, since the piezoelectric member is provided with the communicating section, the manufacturing of the ultrasonic transducer becomes easy. Specifically, in order for providing the space between the piezoelectric member and the diaphragm, the concave groove section is provided to the diaphragm, then the sacrifice layer is provided to the concave groove section to thereby form the state in which the diaphragm and the sacrifice layer form a continuous plane. Then, the piezoelectric member is formed on the surfaces of the diaphragm and the sacrifice layer. Here, since the piezoelectric member is provided with the communicating section as described above, the sacrifice layer can easily be removed by performing isotropic dry etching through the communicating sections, and it is possible to easily form the piezoelectric member covering the concave groove section, and provided with the space with the bottom of the concave groove section.

According to another aspect of the invention, there is provided an ultrasonic sensor including at least one ultrasonic transducer described above, at least one second ultrasonic transducer each including a second support member having a second opening section, a second diaphragm adapted to cover the second opening section, and a second piezoelectric member stacked on the second diaphragm, and adapted to convert a displacement of the second diaphragm into an electrical signal, and output the electrical signal.

According to the ultrasonic sensor of this aspect of the invention, the ultrasonic transducer is made to transmit (output) the ultrasonic wave, and the second ultrasonic transducer is made to receive the ultrasonic wave. The ultrasonic transducer converts the contraction amount of the piezoelectric member into the displacement amount in the deflection direction with respect to the in-plane direction of the diaphragm to thereby output the ultrasonic wave with high sound pressure. However, in the reception of the ultrasonic wave, since the diaphragm and the piezoelectric member do not have close contact with each other, the reception sensitivity is degraded. In contrast, according to the ultrasonic sensor of this aspect of the invention, the second ultrasonic transducer obtained by stacking the piezoelectric member on the diaphragm is separately provided. Since the second ultrasonic transducer has the diaphragm and the piezoelectric member having close contact with each other, it is possible to directly transmit the displacement amount of the diaphragm to the piezoelectric member, and the reception sensitivity becomes preferable. By performing the output and input of the ultrasonic wave with the ultrasonic sensor described above, enhancement in the sound pressure of the ultrasonic wave and the improvement in the reception sensitivity can be realized simultaneously, and therefore, improvement in the quality of the ultrasonic sensor can be achieved.

In the ultrasonic sensor according to this aspect of the invention, it is preferable that a plurality of the ultrasonic transducers and a plurality of the second ultrasonic transducers are arranged in a two-dimensional array structure.

In this aspect of the invention, the ultrasonic transducers and the second ultrasonic transducers described above are arranged to have an array structure. Here, the ultrasonic sensor can have the configuration in which, for example, the ultrasonic transducers and the second ultrasonic transducers are formed to have a two-dimensional array structure in which the ultrasonic transducers and the second ultrasonic transducers are arranged alternately along a predetermined direction, or the configuration in which the two-dimensional array structure of the ultrasonic transducers and the two-dimensional array structure of the second ultrasonic transducers are provided separately.

As described above, by arranging the ultrasonic transducers as the two-dimensional array structure, the ultrasonic wave can be collected toward a desired position by, for example, modifying the output timing of the ultrasonic waves output from the respective ultrasonic transducers, thus it becomes possible to achieve expansion of use. Further, by arranging the second ultrasonic transducers in the two-dimensional array structure, it is possible to appropriately calculate the transmission source of the ultrasonic wave and the reflection point thereof based on the intensity and phase difference of the ultrasonic waves received by the respective second ultrasonic transducers. Therefore, by using such an ultrasonic sensor as described above, accuracy of various processes using the ultrasonic wave such as a detection process, or a cleaning process can be improved. For example, in the case of measuring the position of the object by the ultrasonic wave, it is possible to output the ultrasonic wave with high sound pressure toward the predetermined position, and the position and the shape of the object can be measured appropriately and correctly based on the reflected ultrasonic wave.

In the ultrasonic sensor according to this aspect of the invention, it is preferable that the ultrasonic transducers are disposed in a central area of the two-dimensional array structure, the second ultrasonic transducers are disposed in three or more areas in a periphery of the central area, and a constant potential wiring connected to a constant potential is disposed in an area between the ultrasonic transducers and the second ultrasonic transducers.

According to this configuration, since the constant potential wiring is disposed between the ultrasonic transducers and the second ultrasonic transducers, the electrical noise can be prevented from occurring between the ultrasonic transducers and the second ultrasonic transducers.

In the ultrasonic sensor according to the above aspect of the invention, it is preferable that a sensor array substrate constituting the support member of the at least one ultrasonic transducer, and the second support member of the at least one second ultrasonic transducer.

According to this aspect of the invention, since the same sensor array substrate is used as the support member and the second support member, there is no need for preparing the substrate having the support member for the ultrasonic transducer and the substrate having the second support member for the second ultrasonic transducer separately. Therefore, the configuration of the ultrasonic sensor can be simplified, and at the same time, the labor and the cost necessary for the manufacturing can also be reduced.

According to still another aspect of the invention, there is provided a method of manufacturing an ultrasonic transducer including the steps of (a) forming a film used to form a diaphragm on a substrate, (b) forming a concave groove section by removing a part of a surface of the film used to form a diaphragm by the etching, (c) embedding a sacrifice layer having a surface coplanar with the surface of the film used to form a diaphragm in the concave groove section, (d) forming a piezoelectric member covering the concave groove section, (e) forming a communicating section in the piezoelectric member, the communicating section being adapted to communicate an external space and the sacrifice layer with each other, (f) removing the sacrifice layer from the communicating section, and (g) forming an opening section by etching the substrate to thereby form a support member.

According to this aspect of the invention, the sacrifice layer is embedded into the concave groove section provided to the diaphragm, and then the piezoelectric member is formed on the surface of the diaphragm and the sacrifice layer. On this occasion, the sacrifice layer is formed so that the upper surface of the diaphragm and the surface of the sacrifice layer become coplanar with each other. Therefore, by forming the piezoelectric member on the surface of the film for forming the diaphragm so as to cover the surface of the sacrifice layer in the piezoelectric member forming step (step (d)), it becomes possible to easily form the piezoelectric member having a planar shape of bridging between the outer peripheral ends of the concave groove section. Further, the communicating section is formed in the piezoelectric member by the communicating section forming step (step (e)) and the sacrifice layer removing step (step (f)), and then the sacrifice layer is removed from the communicating section using a method such as isotropic dry etching, thereby making it possible to form the piezoelectric member and the bottom of the concave groove section roughly in parallel to each other, and at the same time, to hold the piezoelectric member in the state of providing the space between the piezoelectric member and the bottom of the concave groove section.

Further, in the case in which the deflection is caused in the piezoelectric member, since the wall portion of the concave groove section is pulled toward the inside thereof after correcting the deflection of the piezoelectric member when the piezoelectric member is contracted, the amount of displacement of the bottom of the concave groove section is reduced as much as the correction of the deflection of the piezoelectric member, and thus the ultrasonic wave output therefrom becomes also weak. In contrast, according to the manufacturing method described above, since no deflection is caused in the piezoelectric member, the contraction amount of the piezoelectric member can directly be converted into the amount of displacement of the bottom of the concave groove section when applying the voltage to the piezoelectric member, and the ultrasonic wave with high sound pressure can be output.

Further, according to yet another aspect of the invention, there is provided a method of manufacturing an ultrasonic sensor including the steps of (h) manufacturing the ultrasonic transducer by the method described above, (i) forming a film used to form a second diaphragm on a substrate, (j) stacking a second piezoelectric member on the second diaphragm, and (k) forming a second opening section by etching the substrate to thereby form a second support member.

According to this aspect of the invention, the ultrasonic sensor is manufactured by the first manufacturing step (step (h)), and the second manufacturing step including the second diaphragm stacking step (step (i)), the second piezoelectric member forming step (step (j)), and the second support section forming step (step (k)).

According to this aspect of the invention described above, the ultrasonic transducer capable of outputting the ultrasonic wave with high sound pressure can easily be manufactured similarly to the aspect of the invention described above by the first manufacturing step, and the second ultrasonic transducer with a simple configuration of only stacking the piezoelectric member on the diaphragm can easily be manufactured by the second manufacturing step.

On this occasion, it is preferable that the diaphragm stacking step (step (a)) and the second diaphragm stacking step (step (i)), the piezoelectric member forming step (step (d)) and the second piezoelectric member forming step (step (j)), and the support member forming step (step (g)) and the second support member forming step (step (k)) are respectively the same in this aspect of the invention.

According to this aspect of the invention, the diaphragm stacking step and the second diaphragm stacking step are the same step, and the film for forming the diaphragms is formed at a time with the same process. Further, the concave groove forming step (step (b)) and the sacrifice layer embedding step (step (c)) are performed only on the ultrasonic transducer, and then the piezoelectric member forming step (step (d)) and the second piezoelectric member forming step (step (j)) are performed in the same step. Thus, it is possible to form the piezoelectric member of the ultrasonic transducer and the second piezoelectric member of the second ultrasonic transducer at a time. Further, by performing the support member forming step (step (g)) and the second support member forming step (step (k)) at the same step after removing the sacrifice layer of the ultrasonic transducer, the support member and the second support member are formed at a time. Thus, the significant reduction in the manufacturing time and the labor can be achieved, and the manufacturing efficiency can be improved compared to the manufacturing method of separately manufacturing the ultrasonic transducer and the second ultrasonic transducer.

BRIEF DESCRIPTION OF THE DRAWINGS

The invention will be described with reference to the accompanying drawings, wherein like numbers reference like elements.

FIGS. 13A through 13C are diagrams showing a configuration of an ultrasonic sensor according to a second embodiment of the invention, wherein FIG. 13A is a perspective view schematically showing the configuration of the ultrasonic sensor, FIG. 13B is a plan view showing a schematic configuration of an ultrasonic wave transmitting sensor array substrate, and FIG. 13C is a plan view showing a schematic configuration of an ultrasonic wave receiving sensor array substrate.

DESCRIPTION OF EXEMPLARY EMBODIMENTS

First Embodiment

A first embodiment of the invention will hereinafter be explained with reference to the accompanying drawings. It should be noted that the scale ratios of the layers and the members are set differently in each of the drawings below in order for illustrating the layers and the members in visible sizes on the drawings. It should also be noted that although in the description below a personal data assistance (PDA) equipped with an ultrasonic sensor incorporating the ultrasonic transducer of the embodiment of the invention will be cited as an example, the invention is not limited thereto, but can be applied to any devices outputting an ultrasonic wave to perform various processes such as a cleaning device for cleaning an object with an ultrasonic wave, or a measuring sensor for performing measurement such as measurement of a distance to an object, measurement of a flow rate, or a nondestructive inspection of plumbing.

1. Configuration of PDA

Figure 1:
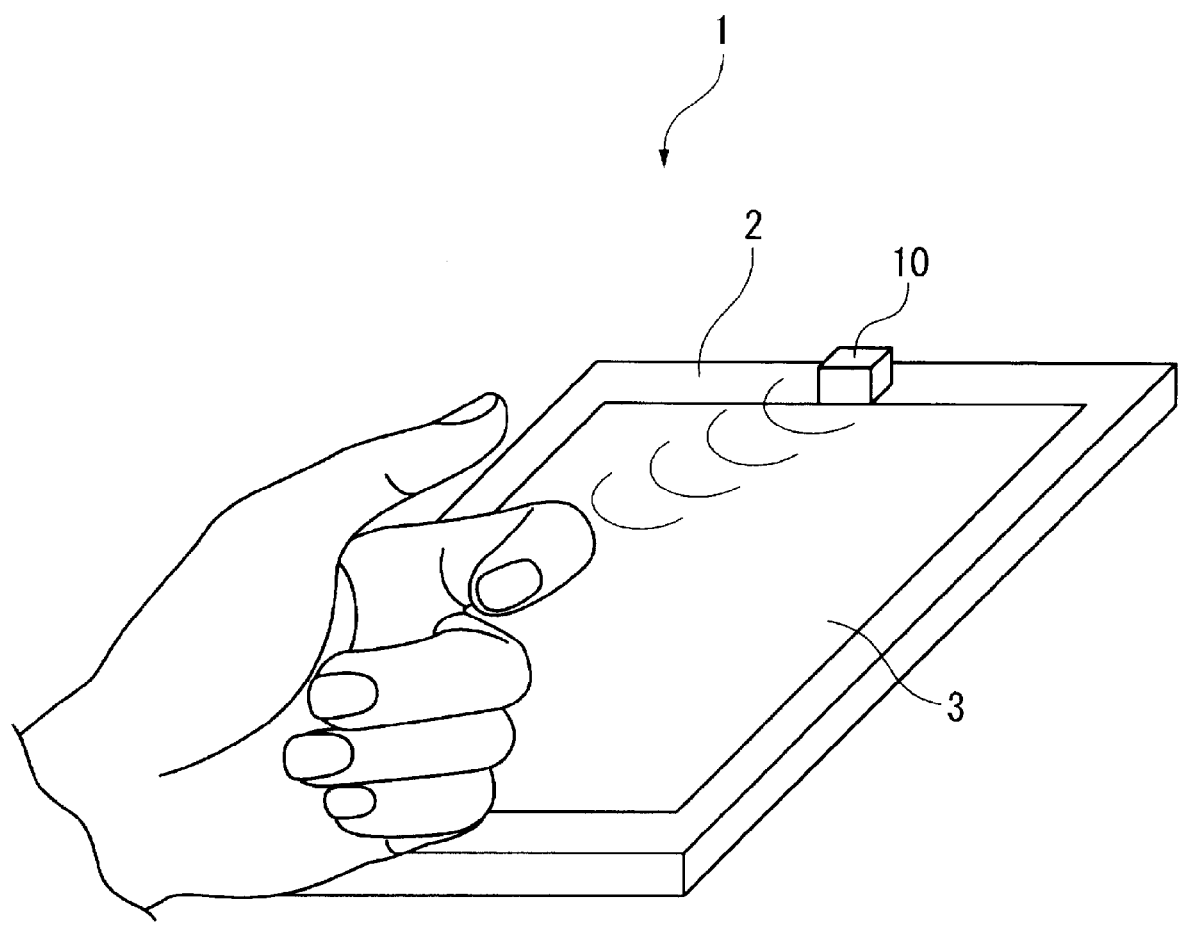
FIG. 1 is a perspective view schematically showing a configuration of a PDA according to a first embodiment of the invention.
Figure 2:
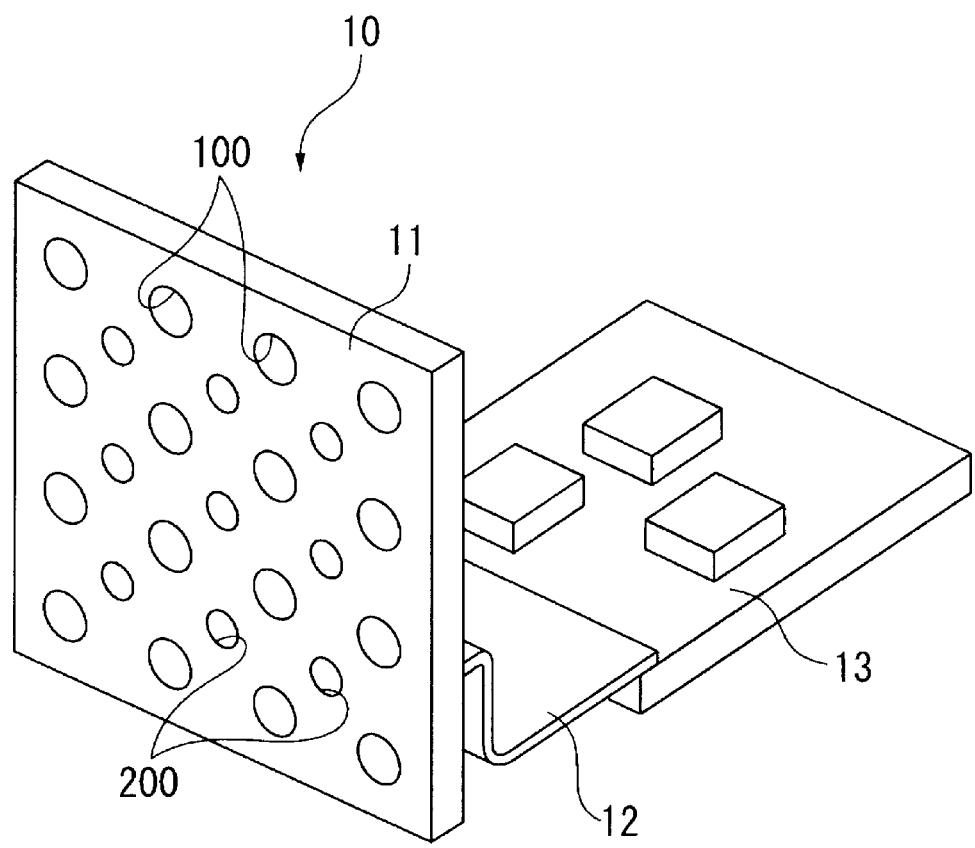
FIG. 2 is a perspective view schematically showing a configuration of an ultrasonic sensor provided to the PDA according to the first embodiment.

FIG. 1 is a perspective view schematically showing a configuration of a PDA 1 according to a first embodiment of the invention. FIG. 2 is a perspective view schematically showing a configuration of an ultrasonic sensor 10 provided to the PDA 1 according to the first embodiment.

In FIG. 1, the PDA 1 is provided with a device main body 2 and a display section 3. The display section 3 is formed of, for example, a liquid crystal panel or an organic panel, connected to an arithmetic control section housed inside the device main body 2, and configured to display various operation images and other information under the control of the arithmetic control section. Further, on the periphery of the device main body 2, there is disposed an ultrasonic sensor 10. The ultrasonic sensor 10 functions as an input device for detecting a shape or an action of, for example, a hand or a finger of a human, or a pen for an input operation to form an input to the PDA 1.

2. Configuration of Ultrasonic Sensor

Further, as shown in FIG. 2, the ultrasonic sensor 10 is provided with a plurality of ultrasonic transducers 100, a plurality of receiver transducers 200 as second ultrasonic transducers, and a sensor array substrate 11 in which the ultrasonic transducers 100 and the receiver transducers 200 are disposed.

The ultrasonic transducers 100 are each an element for transmitting an ultrasonic wave based on a signal from the arithmetic control section, and the receiver transducers 200 are each an element for receiving an ultrasonic wave to convert it into an electric signal, and then outputting it to the arithmetic control section. It should be noted that the detailed configurations of the ultrasonic transducers 100 and the receiver transducers 200 will be described later.

The sensor array substrate 11 is a substrate provided with support sections 110 (see FIG. 5) as support members according to the invention and second support members 210 (see FIG. 7) as second support members, and is made of a semiconductor material such as silicon (Si). Specifically, the support sections 110 are disposed at arrangement positions of the ultrasonic transducers 100, and the second support sections 210 are disposed at the positions of the receiver transducers 200. Further, the sensor array substrate 11 is connected to a control board 13 constituting the arithmetic control section disposed inside the PDA 1 via a flexible circuit board 12.

Figure 3:
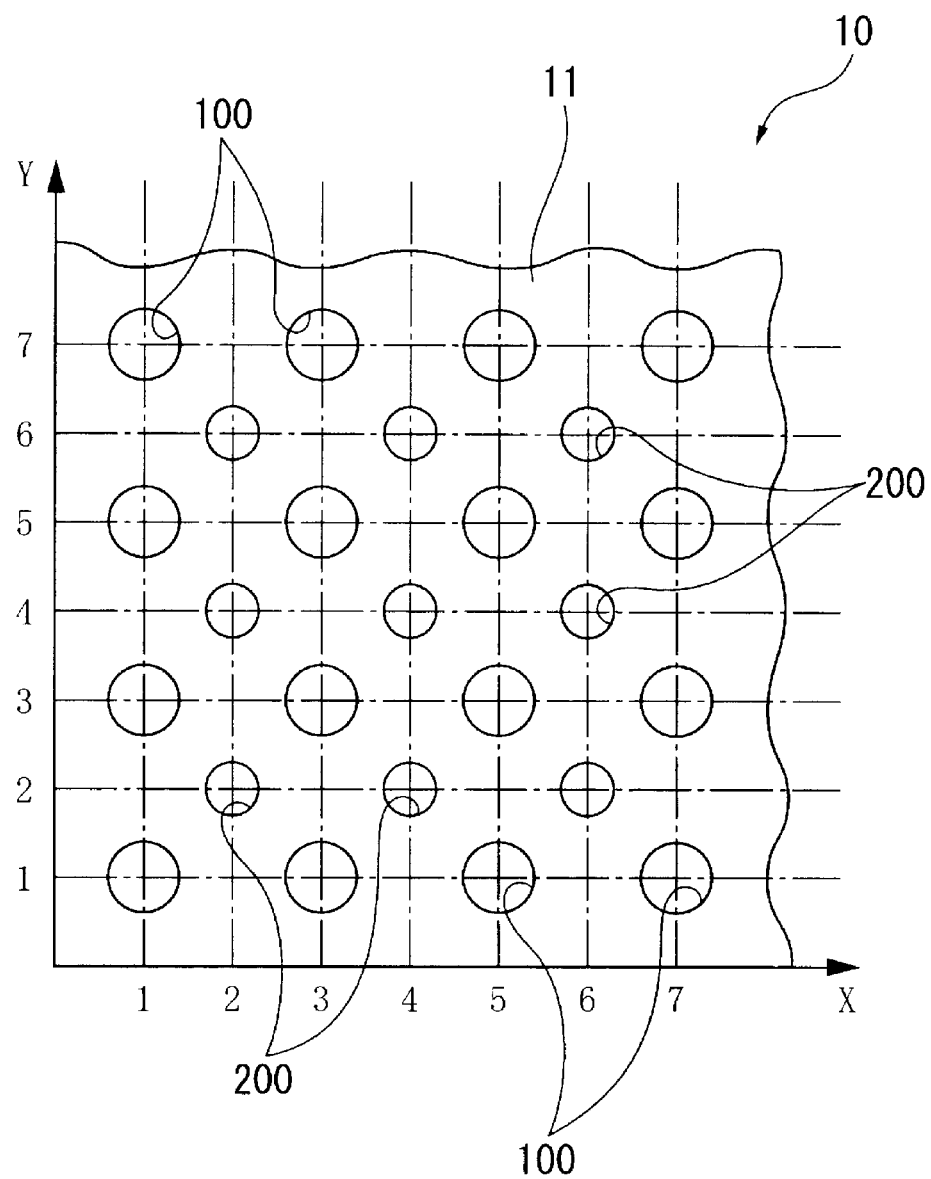
FIG. 3 is a diagram showing an example of an array arrangement structure of ultrasonic transducers and receiver transducers provided to a sensor array substrate of the first embodiment.

FIG. 3 is a diagram showing an example of an array arrangement structure of the ultrasonic transducers 100 and the receiver transducers 200 provided to the sensor array substrate 11.

As shown in FIG. 3, in the plan view (a sensor plan view) of the sensor array substrate 11 viewed from a direction perpendicular to the surface of the sensor array substrate 11, the sensor array substrate 11 is provided with the ultrasonic transducers 100 and the receiver transducers 200 respectively disposed at regular intervals along an X direction and a Y direction perpendicular to the X direction.

More specifically, the receiver transducer 200 is disposed at the center of the four ultrasonic transducers 100, namely the two ultrasonic transducers 100 adjacent to each other along the X direction and the two ultrasonic transducers 100 adjacent respectively to the two ultrasonic transducers 100 in the +Y direction. In other words, in the case of setting the X-axis coordinate and the Y-axis coordinate in the arrangement area of the transducers 100, 200 on the sensor array substrate 11, the ultrasonic transducers 100 are respectively disposed at positions of (2n+1, 2m+1) (n, m are nonnegative integers), and the receiver transducers 200 are respectively disposed at positions of (2n, 2m) (n, m are nonnegative integers).

By evenly arranging the ultrasonic transducers 100 in an array on the sensor array substrate 11 as described above, it is possible to efficiently transmit the ultrasonic wave on the display section 3 of the PDA 1, and further, by controlling the ultrasonic wave transmission timing in each of the ultrasonic transducers 100, it becomes possible to focus the ultrasonic waves at predetermined positions. Further, by evenly arranging the receiver transducers 200 to form an array on the sensor array substrate 11, it becomes possible to efficiently receive the ultrasonic wave reflected by a hand, a finger, or a pen on the display section 3 of the PDA 1, for example. The reason is that in the case of adopting the configuration of providing just one receiver transducer, if no ultrasonic wave returns to the one receiver transducer, the ultrasonic wave received becomes weak. In contrast, by providing the receiver transducers 200 to the sensor array substrate 11 to form an array, wherever on the sensor array substrate 11 the ultrasonic wave is input, the ultrasonic wave can appropriately be received, and it becomes possible to figure out even the position at which the ultrasonic wave is reflected.

Figure 4:
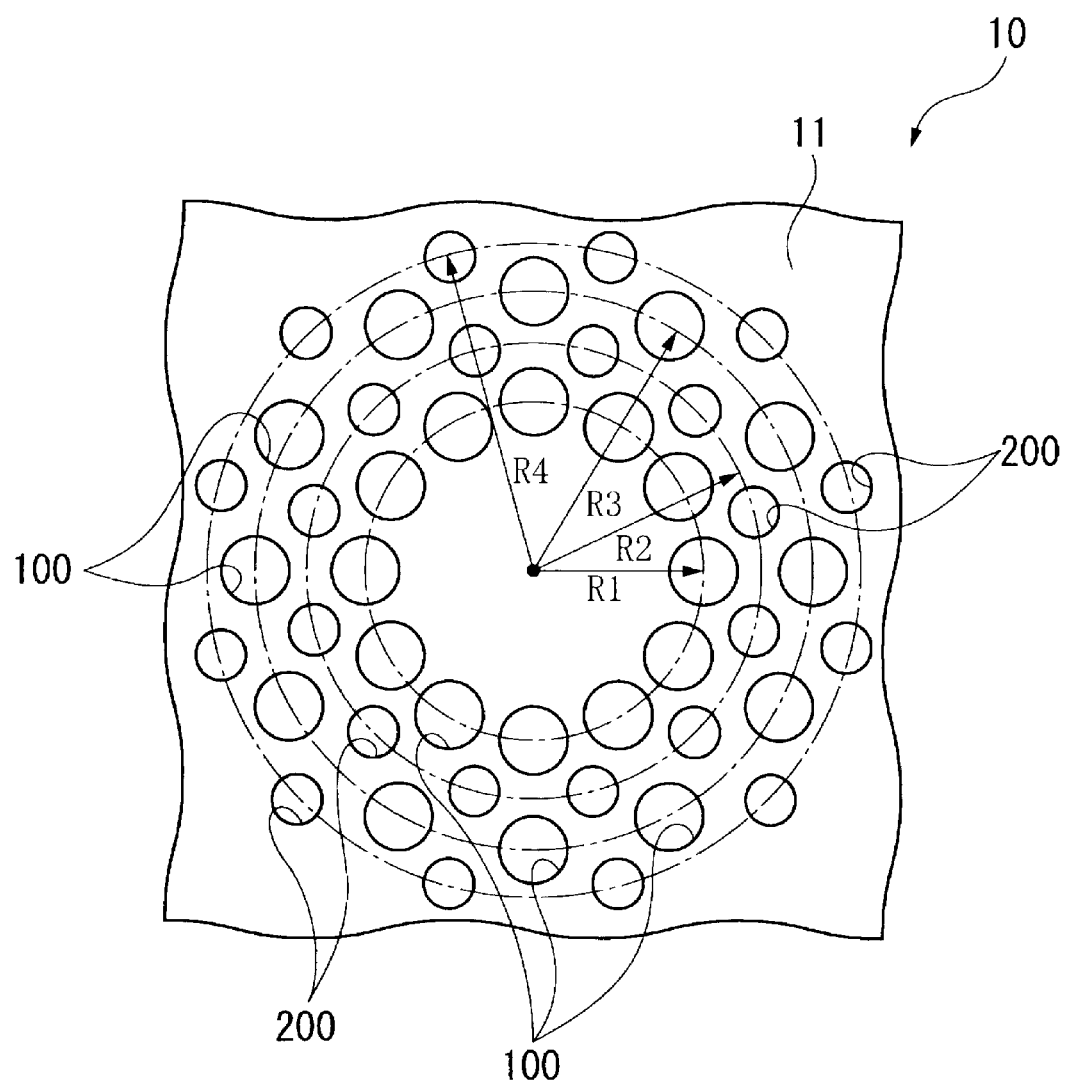
FIG. 4 is a diagram showing another example of the array arrangement structure of the ultrasonic transducer and the receiver transducer provided to the sensor array substrate of the first embodiment.

It should be noted that the arrangement positions of the ultrasonic transducers 100 and the receiver transducers 200 are not limited to the above, but can also be the arrangement structure shown in FIG. 4, for example. FIG. 4 is a diagram showing another example of the array structure arranging the ultrasonic transducers 100 and the receiver transducers 200 on the sensor array substrate 11. In the example shown in FIG. 4, the ultrasonic transducers 100 and the receiver transducers 200 are respectively arranged along a plurality of concentric circles. Specifically, the ultrasonic transducers 100 are disposed along the circles with the radius R from the common center satisfying $R=R_{2n-1}$ at regular intervals, while the receiver transducers 200 are disposed along the circles with the radius R from the common center satisfying $R=R_{2n}$ at regular intervals. Also in such an array arrangement structure, the transmission of the ultrasonic wave in the ultrasonic transducers 100 and the reception of the ultrasonic wave in the receiver transducers 200 can efficiently be performed similarly to the array structure shown in FIG. 3.

3. Configuration of Ultrasonic Transducer

Figure 5:
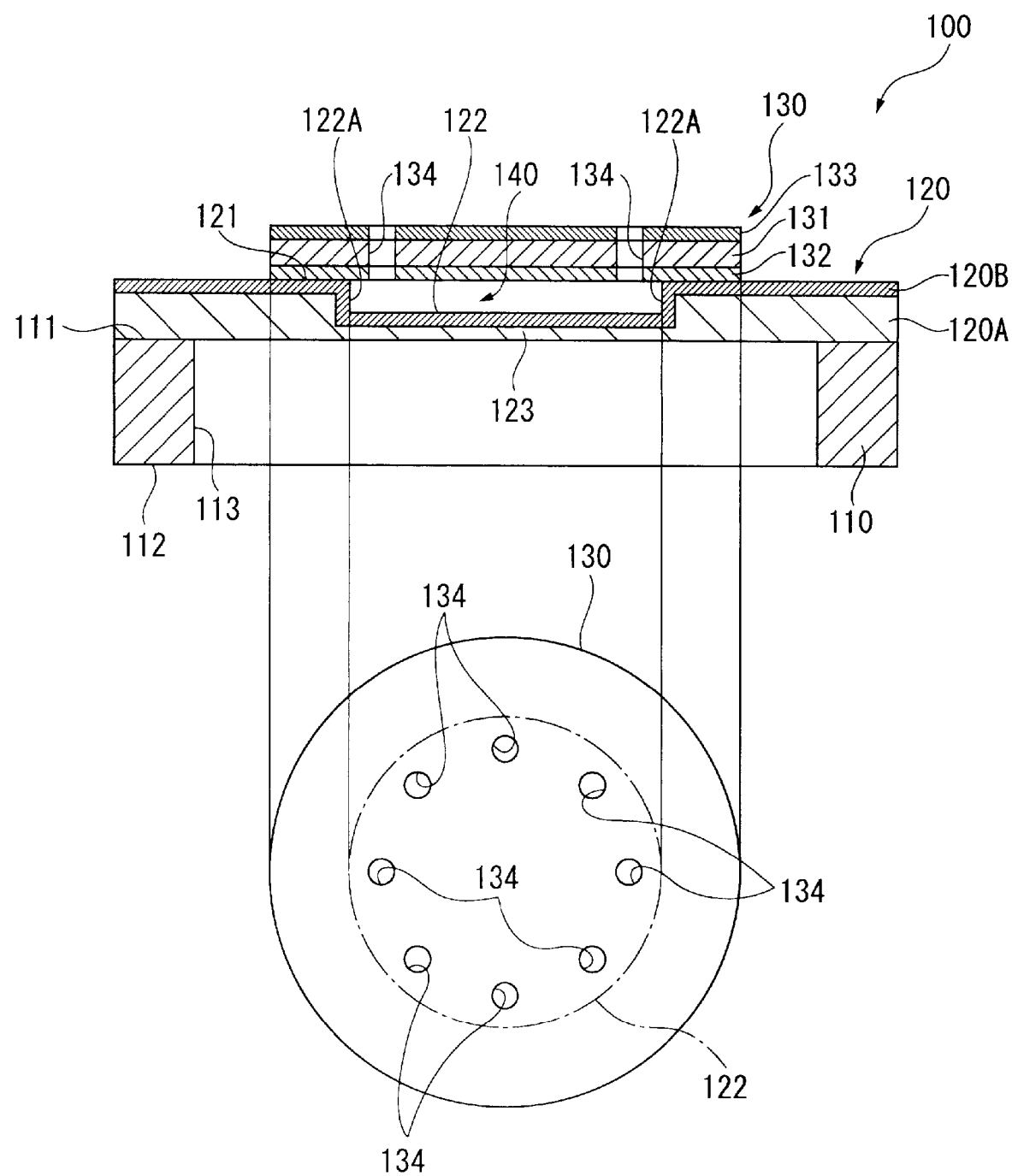
FIG. 5 includes a cross-sectional view schematically showing an appearance of the ultrasonic transducer according to the first embodiment cut along the thickness direction of the sensor array substrate, and a plan view showing a schematic configuration of a piezoelectric member constituting the ultrasonic transducer.
Figure 6:
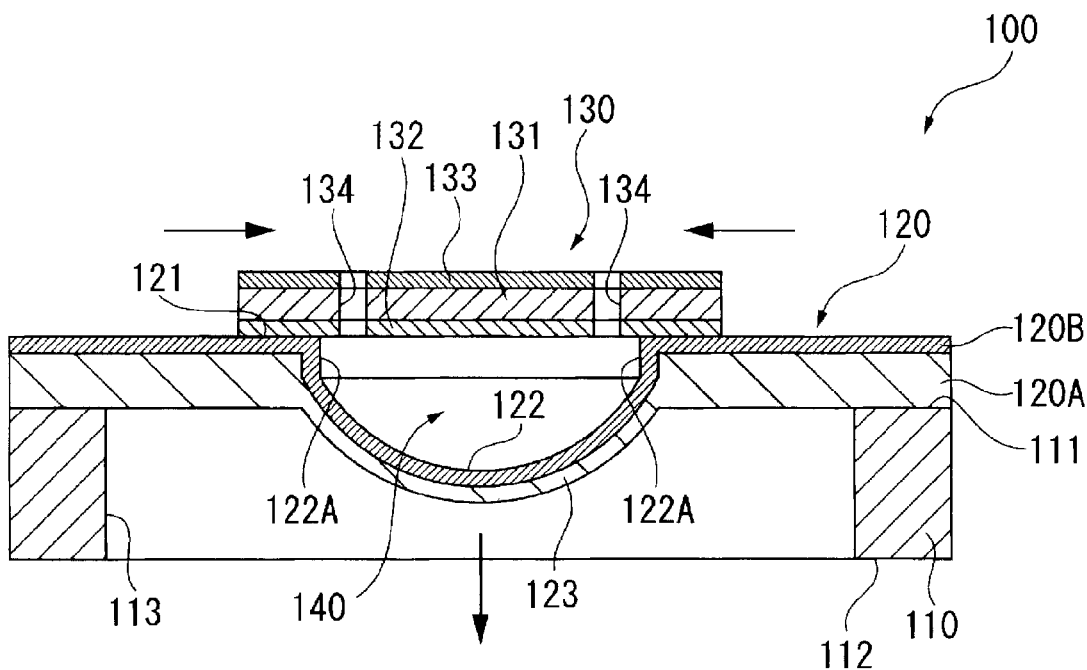
FIG. 6 is a cross-sectional view showing a state of driving the ultrasonic transducer according to the first embodiment.

Then, a specific structure of each of the ultrasonic transducers 100 will be explained with reference to the accompanying drawings. FIG. 5 includes a cross-sectional view schematically showing an appearance of the ultrasonic transducer 100 cut along the thickness direction of the sensor array substrate 11, and a plan view showing a schematic configuration of a piezoelectric member constituting the ultrasonic transducer 100. It should be noted that in the cross-sectional view shown in the upper area of FIG. 5, the upper side of the drawing corresponds to the reverse side of the ultrasonic transducer 100, and the lower side of the drawing corresponds to the obverse side thereof to which the ultrasonic wave is output. FIG. 6 is a cross-sectional view showing a state of driving the ultrasonic transducer 100.

As shown in FIG. 5, the ultrasonic transducer 100 is provided with the support section 110, a diaphragm 120, and a piezoelectric member 130.

The support section 110 is a part of the sensor array substrate 11 formed at the arrangement position of the ultrasonic transducer 100. Here, in the explanation described below, the surface of the sensor array substrate 11 on which the diaphragm 120 is stacked is referred to as a diaphragm forming surface 111, and the surface thereof on the side from which the ultrasonic wave is output, which is the opposite side to the diaphragm forming surface 111 is referred to as an output side surface 112.

The support section 110 is provided with an opening section 113 having an inner periphery cylindrical shape for outputting the ultrasonic wave. The opening section 113 is formed to have a substantially circular shape in, for example, the sensor plan view, and is formed to have a shape penetrating the sensor array substrate 11 from the diaphragm forming surface 111 to the output side surface 112.

The diaphragm 120 is formed on the diaphragm forming surface 111, and covers the opening section 113. The diaphragm 120 is a film-like member having a thickness dimension of, for example, 1 μm, and is deposited on the sensor array substrate 11 (the support section 110) using a method such as sputtering or vapor deposition. Further, in the present embodiment, the diaphragm 120 is formed to have a two-layer structure, and is specifically formed by, for example, depositing an $SiO_2$ layer 120A on the support section 110, and then forming a $ZrO_2$ layer 120B on the $SiO_2$ layer 120A. Here, the $ZrO_2$ layer 120B is a layer for preventing exfoliation of a piezoelectric film 131 of the piezoelectric member 130 when forming the piezoelectric film 131 by calcination described later. In other words, when calcining the piezoelectric film 131 (e.g., PZT), if the $ZrO_2$ layer 120B is not formed, Pb is diffused into the $SiO_2$ layer 120A to thereby lower the melting point of the $SiO_2$ layer 120A, causing bubbles on the surface of the $SiO_2$ layer 120A, and the PZT is exfoliated due to the bubbles. Further, if the $ZrO_2$ layer 120B is not formed, there arises a problem that the deflection efficiency with respect to the strain of the piezoelectric film 131 is degraded. In contrast, if the $ZrO_2$ layer 120B is formed on the $SiO_2$ layer 120A, it becomes possible to avoid the problems such as exfoliation of the piezoelectric film 131 or the degradation of the deflection efficiency.

The diaphragm 120 is exposed from the opening section 113 provided to the support section 110 to the space on the side of the ultrasonic transducer 100 to which the ultrasonic wave is output. Further, the surface (hereinafter referred to as a piezoelectric member opposed surface 121) of the diaphragm 120 having no contact with the support section 110 is provided with a concave groove section 122. The concave groove section 122 is a concave groove formed to have a circular shape concentric with the opening section 113 in the sensor plan view. Further, the concave groove section 122 is formed to have the thickness dimension of the bottom 123 of the concave groove 122, namely the dimension from the bottom of the concave groove section 122 to the surface of the diaphragm 120 exposed to the opening section 113, in a range from 0.3 μm through 0.6 μm. The thickness dimension is a value appropriately set in accordance with the amplitude of the ultrasonic wave to be output. If the thickness dimension becomes smaller than 0.3 μm, the strength of the bottom 123 fails to be maintained and the bottom 123 might be damaged, and if it becomes larger than 0.6 μm, the deflection amount of the bottom 123 is reduced to thereby decrease the amplitude of the ultrasonic wave.

The piezoelectric member 130 is a film-like member formed concentrically with the opening section 113 and the concave groove section 122 in the sensor plan view, and is formed to be larger than the diameter dimension of the concave groove section 122, and smaller than the diameter dimension of the opening section 113. The piezoelectric member 130 is provided with the piezoelectric film 131, and electrodes (a lower electrode 132 and an upper electrode 133) for applying a voltage to the piezoelectric film 131.

The piezoelectric film 131 is formed by depositing, for example, lead zirconate titanate (PZT) to have a film-like shape. It should be noted that although in the present embodiment PZT is used as the piezoelectric film 131, any material capable of contracting in an in-plane direction in response to application of a voltage can also be used, and therefore, lead titanate ($PbTiO_3$), lead zirconate ($PbZrO_3$), and lead lanthanum titanate (($Pb, La)TiO_3$), for example, can also be used.

The lower electrode 132 and the upper electrode 133 are electrodes formed so as to sandwich the piezoelectric film 131, and the lower electrode 132 is formed on the surface of the piezoelectric film 131 opposed to the diaphragm 120, while the upper electrode 133 is formed on the reverse side of the piezoelectric film 131 opposite to the surface thereof opposed to the diaphragm 120. The upper electrode 133 and the lower electrode 132 are led out from lead-out sections not shown formed on the reverse side of the diaphragm 120, and are connected to the flexible circuit board 12, and apply a predetermined voltage to the piezoelectric film 131 in accordance with a voltage signal input from the arithmetic control section.

The piezoelectric member 130 described above is formed to be in the state of covering the concave groove section 122 of the diaphragm 120.

Specifically, as shown in FIG. 5, the piezoelectric member 130 is fixed firmly to the area on the inner circumferential side of the opening section 113 of the support section 110 and on the outer circumferential side of the concave groove 122 of the diaphragm 120. Thus, the piezoelectric member 130 is disposed via a space 140 having a predetermined gap dimension from the bottom 123 of the concave groove section 122 without deflection of the surface thereof opposed to the concave groove section 122.

Further, as shown in the plan view in FIG. 5, the piezoelectric member 130 is also provided with a plurality of communicating holes 134 each having a circular planar shape and corresponding to communicating sections according to the invention disposed evenly at positions opposed to the outer periphery of the concave groove section 122. The communicating holes 134 are formed to penetrate the piezoelectric member 130 in the thickness direction, and communicate the space 140 formed between the diaphragm 120 and the piezoelectric member 130 and the external space with each other.

Further, in such an ultrasonic transducer 100 as described above, when a predetermined drive voltage is applied between the electrodes 132, 133 of the piezoelectric member 130 from the arithmetic control section, the piezoelectric film 131 contracts in the in-plane direction as shown in FIG. 6. Thus, the outer area of the concave groove section 122 of the diaphragm 120 to which the piezoelectric member 130 is fixed is pulled inside the concave groove section 122. Therefore, the inner circumferential wall 122A of the concave groove section 122 is also displaced toward the central axis of the concave groove section 122, and the bottom 123 of the concave groove section 122 is deflected in the direction in which the ultrasonic wave is output as shown in FIG. 6. Further, when the voltage applied to the piezoelectric film 131 is cut or a negative voltage is applied thereto, the piezoelectric film 131 returns to an initial state shown in FIG. 5. In other words, by applying an alternating voltage as the drive voltage, the piezoelectric member 130 expands and contracts in the in-plane direction, and thus the bottom 123 of the concave groove section 122 vibrates in a direction perpendicular to the in-plane direction, and therefore, the ultrasonic wave corresponding to the amount of vibration of the bottom 123 is continuously output in the output direction. On this occasion, since the piezoelectric member 130 is disposed in the area opposed to the concave groove section 122 via the space 140, and is not fixed firmly to the diaphragm 120, no resistance is caused and a large contraction amount can be obtained. Further, since the contraction amount of the piezoelectric member 130 is converted into the displacement in the direction perpendicular to the in-plane direction of the bottom 123, the displacement amount of the bottom 123 becomes larger compared to the contraction amount of the piezoelectric member 130. In such a manner as described above, since the displacement amount of the bottom 123 is amplified, it becomes possible to output an ultrasonic wave with high sound pressure.

4. Configuration of Receiver Transducer

Figure 7:
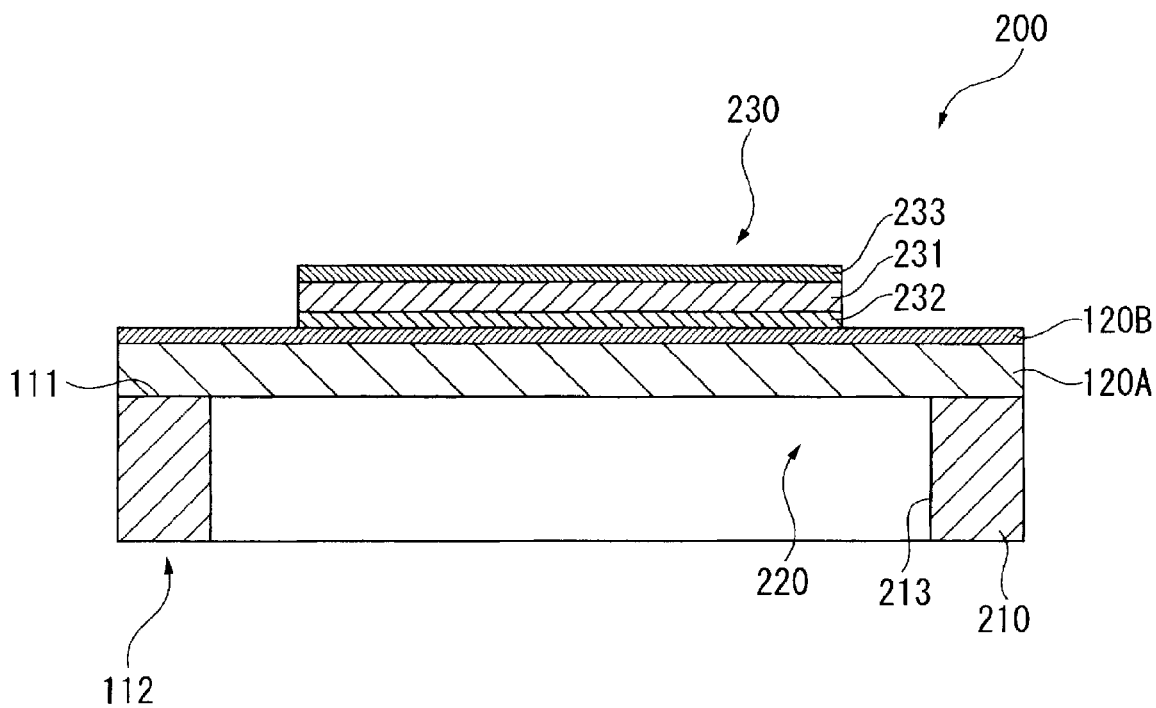
FIG. 7 is a cross-sectional view showing a schematic configuration of the receiver transducer according to the first embodiment.

Then, the configuration of each of the receiver transducers 200 provided to the sensor array substrate 11 will be explained. FIG. 7 is a cross-sectional view showing a schematic configuration of the receiver transducer.

As shown in FIG. 7, the receiver transducer 200 is provided with the second support section 210, a second diaphragm 220, and a second piezoelectric member 230. It should be noted that in the present embodiment although the receiver transducer 200 is formed to have a diameter dimension smaller than the diameter dimension of the ultrasonic transducer 100 in the sensor plan view as shown in FIGS. 2 through 4, the invention is not limited thereto, but the configuration of forming the receiver transducer 200 to have substantially the same size as that of the ultrasonic transducer 100, or the configuration of forming the receiver transducer 200 to have a larger diameter dimension than that of the ultrasonic transducer 100 can also be adopted, for example.

The second support section 210 is a part of the sensor array substrate 11 formed at the arrangement position of the receiver transducer 200. The second support section 210 is provided with a second opening section 213 to which the ultrasonic wave is input. The second opening section 213 is formed to have, for example, a substantially circular shape in the sensor plan view, and the second diaphragm 220 displaced in accordance with the ultrasonic wave input thereto is disposed so as to be exposed to the second opening section 213.

The second diaphragm 220 is formed on the reverse side (the diaphragm forming surface 111) of the second support section 210. Similarly to the diaphragm 120, the second diaphragm 220 is a film-like member having a thickness dimension of, for example, 1 μm, and is deposited simultaneously when forming the diaphragm 120 using a method such as sputtering or vapor deposition. In other words, similarly to the diaphragm 120, the second diaphragm 220 is formed to have a two-layer structure, and is specifically formed by, for example, depositing the $SiO_2$ layer 120A on the sensor array substrate 11, and then forming the $ZrO_2$ layer 120B on the $SiO_2$ layer 120A. In the present embodiment, the diaphragm 120 and the second diaphragm 220 are formed contiguously on the sensor array substrate 11. It should be noted that the invention is not limited thereto, but there are also adopted the configuration in which the diaphragm 120 and the second diaphragm 220 are not contiguous on the sensor array substrate 11 but are formed as separate members respectively.

Further, the second diaphragm 220 in the receiver transducer 200 is formed to have a planate reverse side, and the concave groove section 122 is not provided.

The second piezoelectric member 230 is formed on the second diaphragm 220 so as to have close contact therewith, and when the second diaphragm 220 is deflected, the second piezoelectric member 230 is also deflected with the same amount of deflection. The second piezoelectric member 230 is provided with a second piezoelectric film 231, and electrodes (a lower electrode 232 and an upper electrode 233) for applying a voltage to the second piezoelectric film 231.

Similarly to the piezoelectric film 131 of the ultrasonic transducer 100, the second piezoelectric film 231 is formed of PZT shaped like a film. It should be noted that also in the second piezoelectric film 231, lead titanate ($PbTiO_3$), lead zirconate ($PbZrO_3$), and lead lanthanum titanate (($Pb$, $La$)$TiO_3$), for example, can also be used instead of PZT described above.

The lower electrode 232 and the upper electrode 233 are electrodes formed so as to sandwich the second piezoelectric film 231, and the lower electrode 232 is formed on the surface of the second piezoelectric film 231 opposed to the second diaphragm 220, while the upper electrode 233 is formed on the reverse side of the second piezoelectric film 231 opposite to the surface thereof on which the lower electrode 232 is formed. The upper electrode 233 and the lower electrode 232 are respectively led out from lead-out sections not shown formed on the reverse side of the second diaphragm 220, and connected to the flexible circuit board 12.

Further, in such a receiver transducer 200 as described above, when the ultrasonic wave is input from the second opening section 213, the second diaphragm 220 is vibrated in accordance with the intensity of the ultrasonic wave, and the second piezoelectric member 230 fixed firmly to the second diaphragm 220 is also vibrated. Then, the second piezoelectric film 231 is deflected due to the vibration of the second piezoelectric member 230, and the electrical signal corresponding to the amount of deflection is output from the upper electrode 233 and the lower electrode 232 to the arithmetic control section via the flexible circuit board 12.

5. Manufacture of Ultrasonic Sensor

Then, a method of manufacturing the ultrasonic sensor 10 described above will be explained with reference to the drawings.

FIGS. 8A through 12 are diagrams showing the manufacturing process of the ultrasonic sensor 10, wherein each of the diagrams shows a cross-sectional surface of the ultrasonic transducer 100 in each step on the left thereof, and a cross-sectional surface of the receiver transducer 200 in each step on the right thereof.

In the present embodiment the ultrasonic sensor 10 has the ultrasonic transducers 100 and the receiver transducers 200 formed simultaneously on the sensor array substrate 11, thereby achieving improvement in the manufacturing efficiency. Specifically, in the manufacturing process of the ultrasonic sensor 10, a diaphragm forming step for forming the diaphragms 120 and the second diaphragms 220 on the sensor array substrate 11 is performed.

Figure 8A:
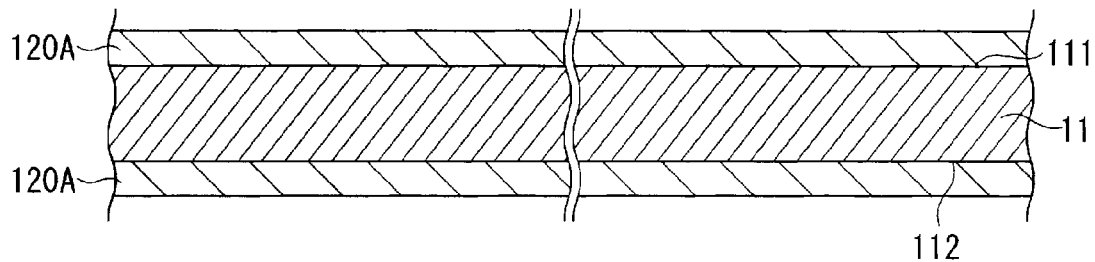
FIGS. 8A through 8D are diagrams showing a process of manufacturing the ultrasonic sensor according to the first embodiment.

In this step, as shown in FIG. 8A, the $SiO_2$ layer 120A for forming the diaphragms is firstly deposited (a diaphragm stacking step, a second diaphragm stacking step) on the surface of the sensor array substrate 11 shaped like a plate to which the opening sections 113 and the second opening sections 213 are not provided. The $SiO_2$ layer 120A is formed on all of the surfaces of the substrate (the surface on the side of the output, the surface on which the diaphragms are formed, and the side surfaces).

Figure 8B:
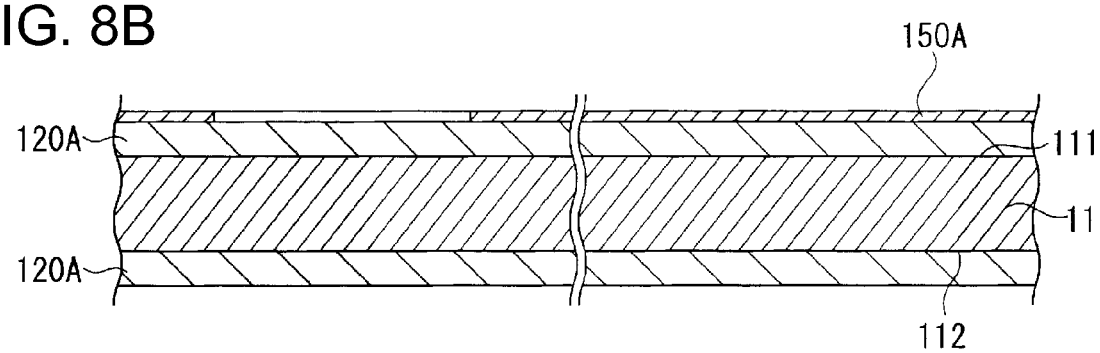

Then, as shown in FIG. 8B, a resist 150A for forming the concave groove sections 122 of the ultrasonic transducers 100 is deposited on the $SiO_2$ layer 120A. In other words, all areas other than the areas to which the concave groove sections 122 are to be provided are masked by the resist 150A.

Figure 8C:
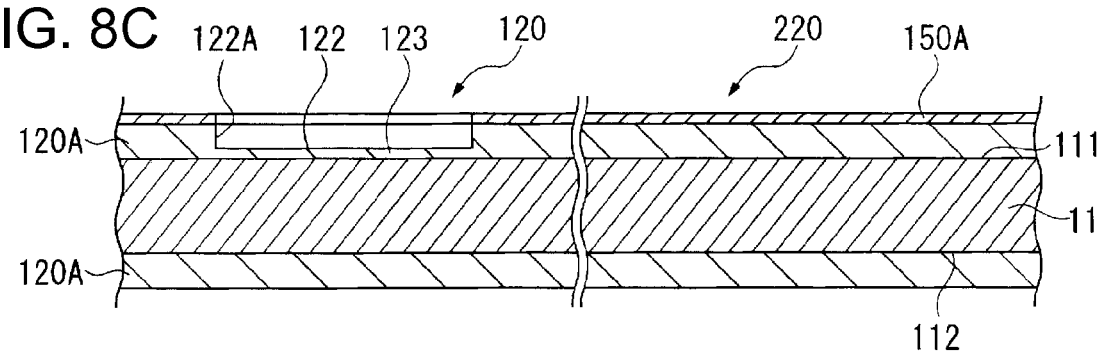

Subsequently, as shown in FIG. 8C, the $SiO_2$ layer in the area in which the resist 150A is not deposited is etched by reactive ion etching (RIE) using inductive coupled plasma (ICP) etching equipment to thereby form (a concave groove forming step) the concave groove sections 122. It should be noted that although the RIE (ICP-RIE) by the ICP etching equipment is preferably used in the present embodiment since it is required to etch the $SiO_2$ layer 120A deposited thereon with high accuracy to thereby form the concave groove sections 122, it is also possible to use other etching processes. On this occasion, the etching of the $SiO_2$ layer is performed so that the depth dimension of each of the concave groove sections 122 becomes, for example, 0.5 μm. It should be noted that although the concave groove sections 122 each having a groove depth of 0.5 μm are formed, the depth dimension of the concave groove sections 122 can arbitrarily be set within a range of 0.3 through 0.6 μm as described above.

Figure 8D:
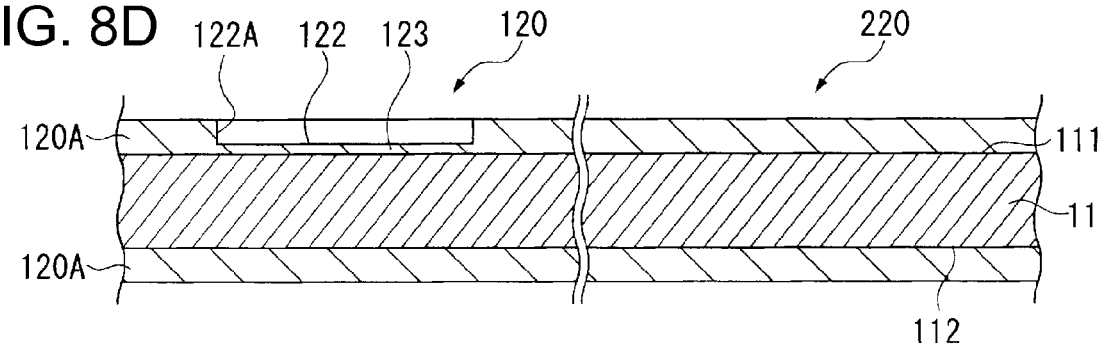
Figure 9A:
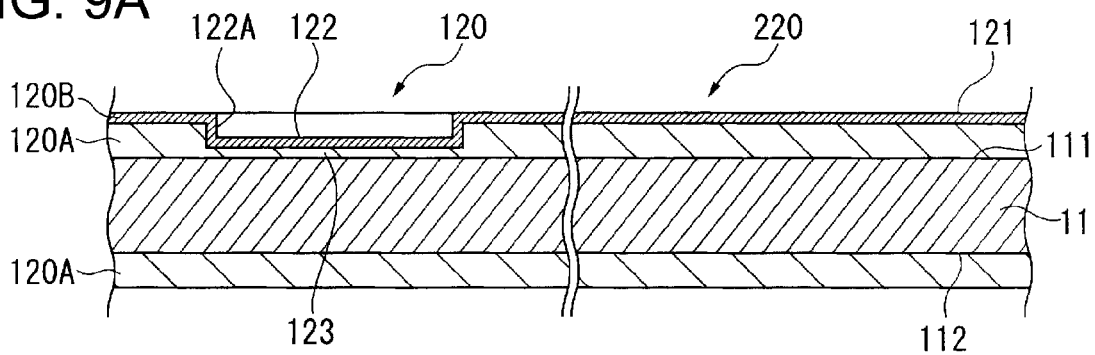
FIGS. 9A through 9D are diagrams showing the process of manufacturing the ultrasonic sensor following FIG. 8D.

Subsequently, the resist 150A for forming the concave groove sections 122 is removed as shown in FIG. 8D, and then the $ZrO_2$ layer 120B is formed on the $SiO_2$ layer 120A as shown in FIG. 9A. The $ZrO_2$ layer 120B with the thickness of 0.4 μm is deposited by, for example, depositing a Zr layer of 0.26 μm, and then oxidizing it by rapid thermal annealing (RTA).

By the process described above, the diaphragms 120 of the ultrasonic transducers 100 and the second diaphragms 220 of the receiver transducers 200 are manufactured.

After the diaphragm forming step, a sacrifice layer embedding step for embedding a sacrifice layer 151 into the concave groove sections 122 of the diaphragms 120 is performed.

Figure 9B:
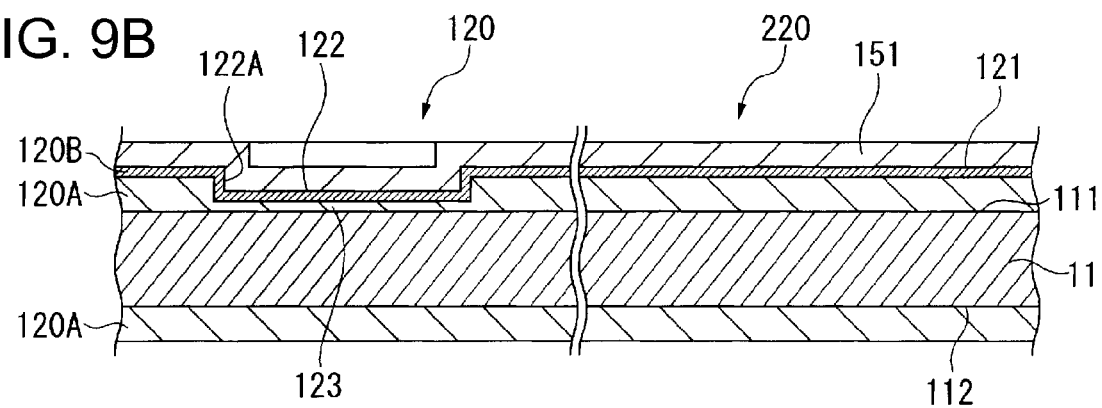

In this step, as shown in FIG. 9B, the sacrifice layer 151 is formed on the $ZrO_2$ layer 120B of the diaphragms 120 and the second diaphragms 220. As the sacrifice layer 151, silicon (Si) is used, for example. Further, a film formation method capable of forming a film with a constant thickness with respect to a surface with an uneven portion can preferably be used for forming the sacrifice layer 151, and chemical vapor deposition (CVD) is used in the present embodiment. On this occasion, the sacrifice layer 151 is formed to have a thickness equal to or larger than the depth dimension of the concave groove sections 122 to thereby fill the concave groove sections 122 with the sacrifice layer 151.

Figure 9C:
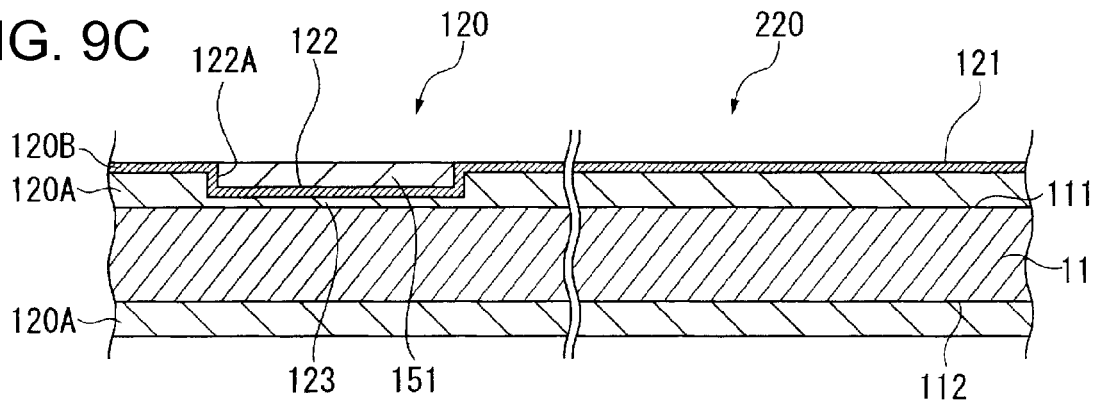
Figure 9D:
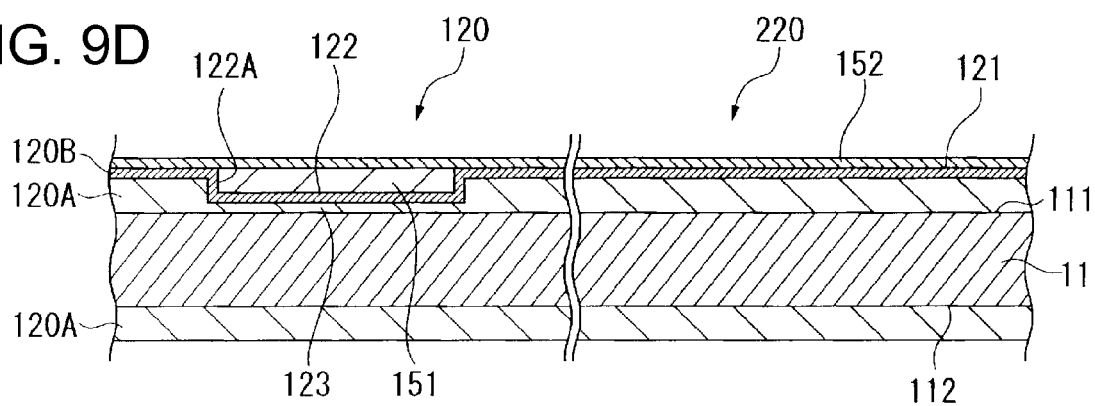

Subsequently, as shown in FIG. 9C, the sacrifice layer 151 on the sensor array substrate 11 is polished until the $ZrO_2$ layer 120B is exposed, thereby removing the sacrifice layer 151 except one filling the concave groove sections 122. On this occasion, the sacrifice layer 151 is preferably removed by chemical mechanical polishing (CMP), and it is possible to remove only the portion of the sacrifice layer 151 stacked in other areas than the concave groove sections 122 by CMP at a high rate, and at the same time to make the surface of the sacrifice layer 151 of the concave groove sections 122 flat and smooth.

Then, after the sacrifice layer embedding step, a piezoelectric member stacking step for stacking a film for forming the piezoelectric members 130 and the second piezoelectric members 230 is performed.

In the piezoelectric member stacking step, an electrically-conductive film 152 for forming the lower electrodes 132, 232 is firstly formed on the diaphragms 120 (the second diaphragms 220) after the sacrifice layer embedding step described above by sputtering as shown in FIG. 9D. In the present embodiment, a laminate structure film made of Ti/Ir/Pt/Ti, for example, is used as the conductive film 152, and the conductive film is formed so as to have a thickness of 0.2 μm after calcination of the piezoelectric film 131 (the second piezoelectric film 231).

Figure 10A:
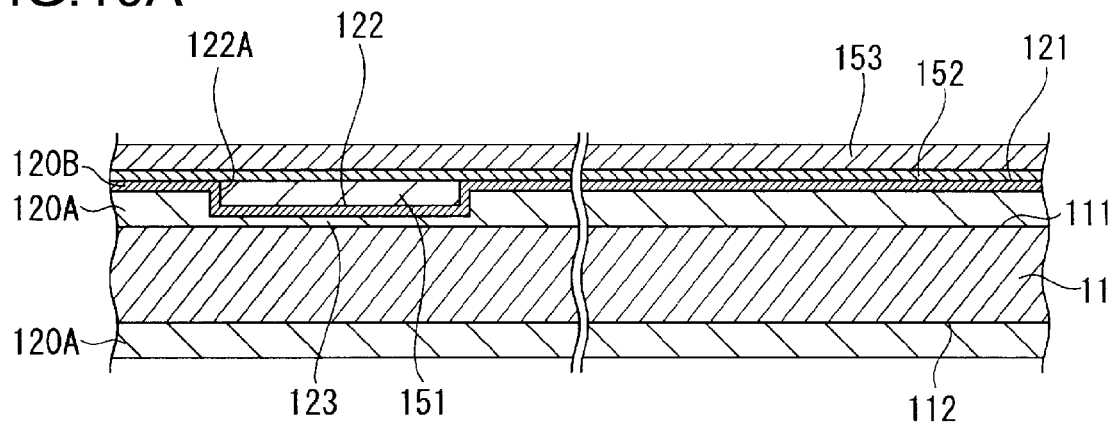
FIGS. 10A through 10C are diagrams showing the process of manufacturing the ultrasonic sensor following FIG. 9D.

Subsequently, as shown in FIG. 10A, a PZT film 153 for forming the piezoelectric film 131 and the second piezoelectric member 230 is deposited on the surface of the conductive film 152. The PZT film 153 is formed using a metal organic decomposition (MOD) method so as to have 12 layers with a total thickness dimension of 1.4 μm, for example.

Figure 10B:
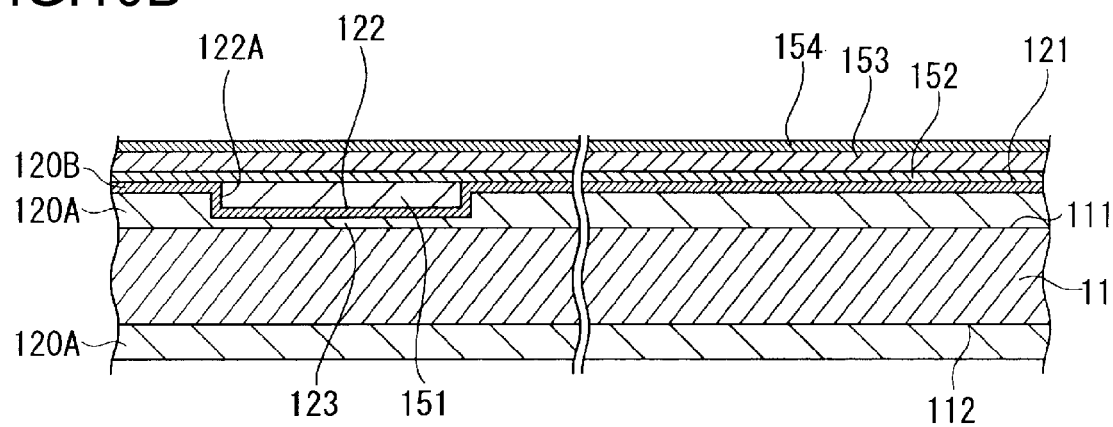

Then, as shown in FIG. 10B, a conductive film 154 for forming the upper electrodes 133, 233 is formed on the PZT film 153 thus formed as described above by sputtering. The conductive film 154 for forming the upper electrodes 133, 233 is formed using, for example, an Ir film so as to have a thickness dimension of, for example, 50 nm.

Subsequently, after the piezoelectric member stacking step, a piezoelectric member forming step (a second piezoelectric member forming step) for forming the piezoelectric members 130 (the second piezoelectric members 230) is performed. In the piezoelectric member forming step, a communicating section forming step according to the invention is performed simultaneously.

Figure 10C:
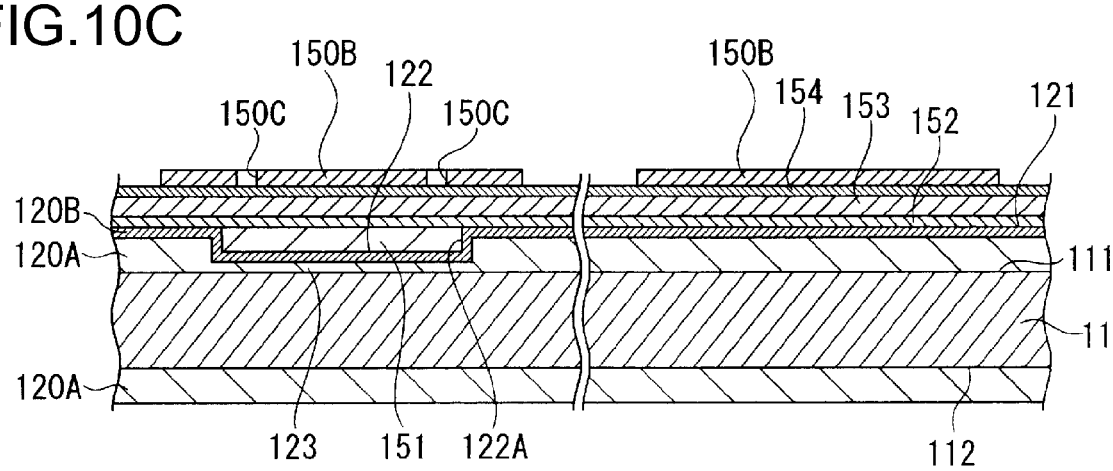
Figure 11A:
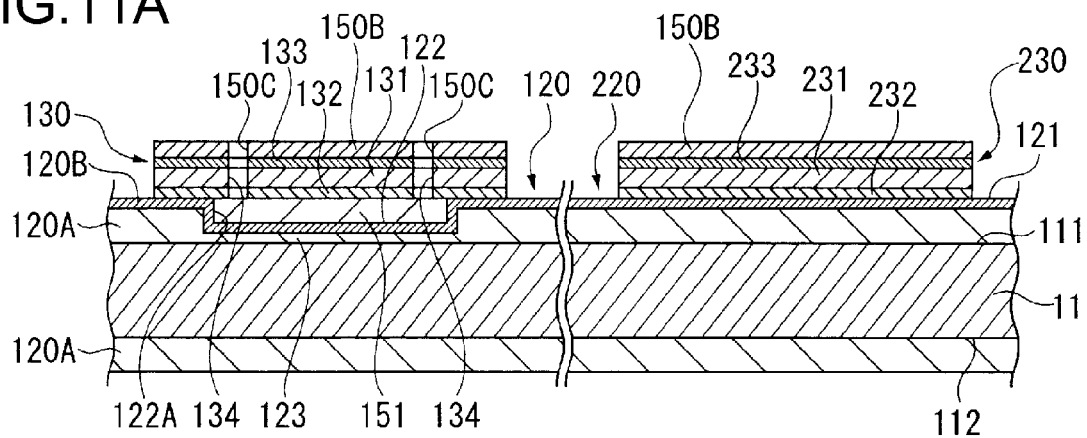
FIGS. 11A through 11C are diagrams showing the process of manufacturing the ultrasonic sensor following FIG. 10C.
Figure 11B:
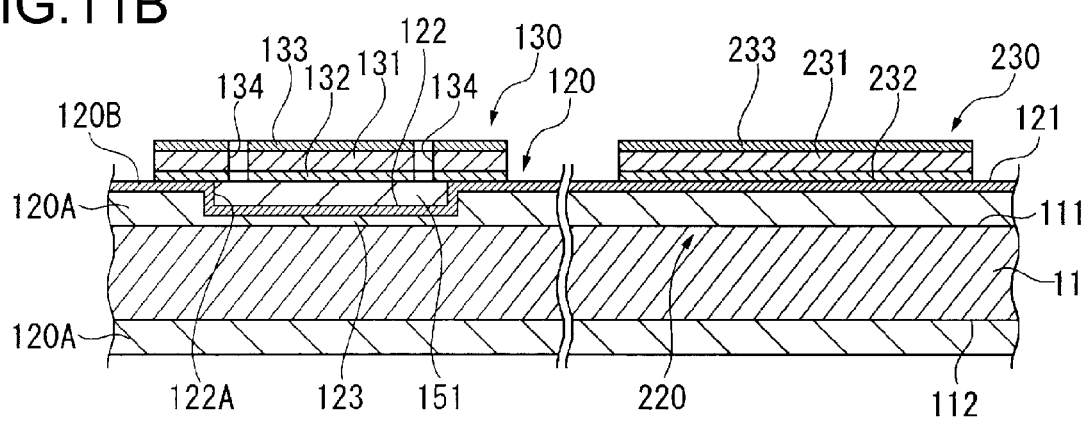

Specifically, in the piezoelectric member forming step (the second piezoelectric member forming step), resist 150B is formed on the conductive film 154 for forming the upper electrodes at each of the positions where the piezoelectric members 130 and the second piezoelectric members 230 are formed as shown in FIG. 10C. On this occasion, the resist 150B for forming the piezoelectric members 130 of the ultrasonic transducers 100 is provided with hole sections 150C for forming the communicating holes 134. Subsequently, dry etching is performed on the portions other than the portions where the resist 150B is deposited using ICP-RIE as shown in FIG. 11A, and then the resist 150B is removed as shown in FIG. 11B. Thus, the piezoelectric members 130, the second piezoelectric members 230, and the communicating holes 134 penetrating the piezoelectric member 130 are formed.

Subsequently, after forming the piezoelectric members 130, the second piezoelectric members 230, and the communicating holes 134, a sacrifice layer removing step for removing the sacrifice layer 151 formed so as to fill the concave groove sections 122 of the ultrasonic transducers 100 is performed.

Figure 11C:
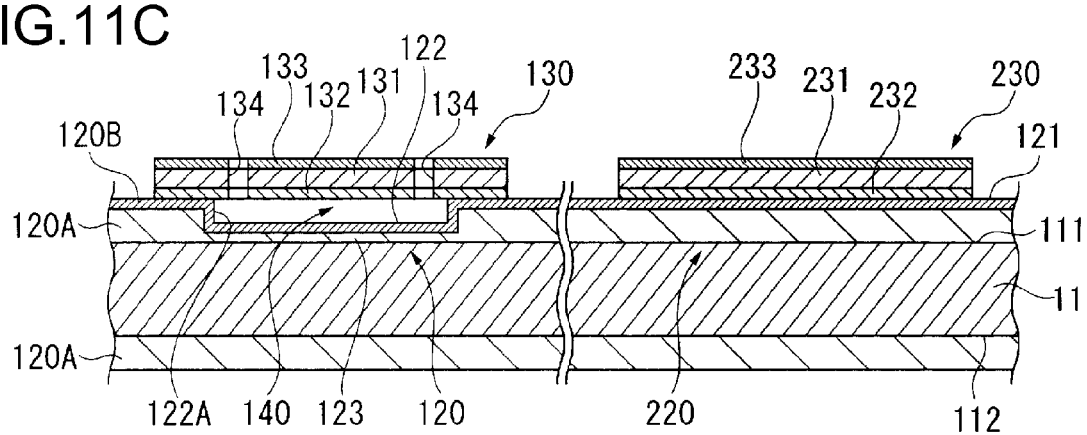

In the sacrifice layer removing step, an etching gas such as $XeF_2$ is made to flow into from the communicating holes 134, thereby isotropically etching only the sacrifice layer 151 (Si) inside each of the concave groove sections 122, and thus, the space 140 is formed between each of the piezoelectric members 130 and the bottom 123 of the corresponding concave groove section 122 as shown in FIG. 11C.

It should be noted that on this occasion, if the $SiO_2$ layer 120A for forming the diaphragms is deposited on the outer circumferential surface of the sensor array substrate 11, there is no chance of the Si substrate on the surface of the sensor array substrate 11 on the side from which the ultrasonic wave is output being etched. In contrast, if the $SiO_2$ layer 120A is formed only on the diaphragm forming surface 111 of the sensor array substrate 11, it is necessary to mask the side surfaces and the output side surface 112 of the sensor array substrate 11.

After the sacrifice layer removing step, a substrate processing step corresponding to a support member forming step and a second support member forming step according to the invention for processing the sensor array substrate 11 to form the support sections 110 and the second support sections 210 is performed.

In order for performing this step, the thickness dimension of the sensor array substrate 11 is firstly adjusted. Specifically, when forming the opening sections 113 and the second opening sections 213 in the support sections 110 and the second support sections 210, in order for reducing the depth of the etching, the $SiO_2$ layer 120A formed on the output side surface 112 of the sensor array substrate 11 and the output side surface 112 of the sensor array substrate 11 are ground. Here, the opening sections 113 and the second opening sections 213 are formed by etching using the ICP equipment, and therefore, taking the depth dimension of etching, rigidity against the film stress warpage, and the strength in handling into consideration, it is preferable to grind them so that the Si thickness dimension of the sensor array substrate 11 becomes 200 μm.

Figure 12:
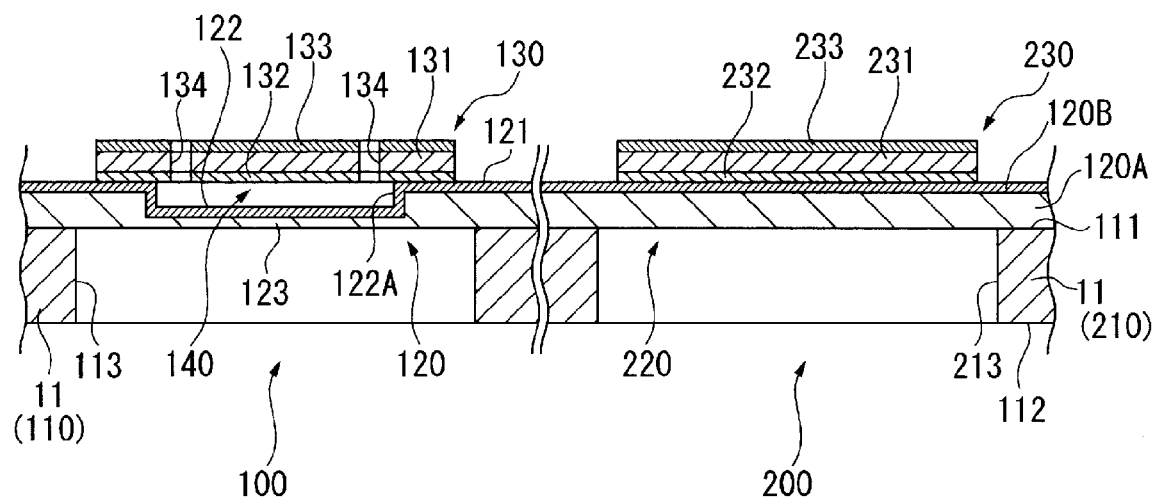
FIG. 12 is a diagram showing the process of manufacturing the ultrasonic sensor following FIG. 11C.

Although not shown in the drawings, in the formation of the opening sections 113 and the second opening sections 213, resist is formed on the output side surface 112 of the sensor array substrate 11 except the areas where the opening sections 113 or the second opening sections 213 are to be formed. The resist is formed to have a thickness of, for example, about 10 μm so as to be able to endure the etching of the sensor array substrate 11 as deep as 200 μm. Subsequently, as shown in FIG. 12, using the ICP equipment, the sensor array substrate 11 is etched from the output side surface 112 up to the $SiO_2$ layer 120A of the diaphragms 120.

According to the process described above, the sensor array substrate 11 provided with the plurality of ultrasonic transducers 100 and the plurality of receiver transducers 200 is manufactured.

It should be noted that although in the present embodiment there is described the example in which the sensor array substrate 11 forms the support sections 110 and the second support sections 210, and the diaphragms 120 and the second diaphragms 220 are formed integrally, it is also possible to adopt the configuration in which the ultrasonic transducers 100 manufactured as separate parts and the receiver transducers 200 manufactured as separate parts are mounted at predetermined positions on the sensor array substrate. In this case, in the manufacturing method described above, the sensor array substrate 11 is substituted with an Si substrate forming the support sections 110 of the ultrasonic transducers 100 and the second support sections 210 of the receiver transducers 200. Further, as described in the above manufacturing method, after manufacturing the ultrasonic transducers 100 and the receiver transducers 200, the ultrasonic transducers 100 and the receiver transducers 200 are cut by, for example, laser cut. Thus, the ultrasonic transducers 100 and the receiver transducers 200 separated into discrete parts can be manufactured.

6. Action and Advantages of First Embodiment

As described above, the ultrasonic transducer 100 constituting the ultrasonic sensor 10 according to the first embodiment is provided with the diaphragm 120 in the opening section 113 of the support section 110, and the concave groove section 122 in the piezoelectric member opposed surface 121 of the diaphragm 120. Further, the piezoelectric member 130 is fixed firmly to the outer periphery of the concave groove section 122 of the diaphragm 120 so as to cover the concave groove section 122.

In the ultrasonic transducer 100 with such a configuration, when a voltage is applied to the piezoelectric member 130 to cause contraction inward in the plane direction, the outer circumferential wall surface of the concave groove section 122 is displaced inward, the bottom 123 of the concave groove section 122 is deflected toward the direction in which the ultrasonic wave is output, and thus the ultrasonic wave is output. In such a configuration, since the bottom 123 is displaced while amplifying the contraction amount of the piezoelectric member 130, a large amount of deflection of the bottom 123 can be obtained. Further, since the space 140 is formed between the piezoelectric member 130 and the bottom 123, the resistance is reduced and the amount of contraction increases when the piezoelectric member 130 contracts.

According to the above, the amount of deflection of the bottom 123 of the concave groove section 122 can be increased and the ultrasonic wave with high sound pressure can be output compared to, for example, the configuration in which the entire one side surface of the piezoelectric member 130 is fixed firmly to the surface of the diaphragm.

Further, since the piezoelectric member 130 is provided with the communicating holes 134, it becomes possible to easily providing the space described above between the piezoelectric member 130 and the concave groove section 122 of the diaphragm 120. Specifically, the piezoelectric member 130 constituting a part of the ultrasonic transducer 100 is composed of the lower electrode 132 having a film-like shape, the upper electrode 133, and the piezoelectric film 131. It is difficult to form the piezoelectric member 130 in the condition of keeping the space with the bottom 123 of the concave groove section 122 of the diaphragm 120 simply by stacking the piezoelectric member 130 on the diaphragm 120, and there arises a problem that the piezoelectric member 130 is deflected toward the concave groove section 122, for example. Therefore, it leads that the sacrifice layer 151 is embedded in the concave groove section 122, and then the piezoelectric member 130 is stacked above the sacrifice layer 151, and in this case, removal of the sacrifice layer becomes difficult. In contrast, according to the present embodiment, since the piezoelectric member 130 is provided with the communicating holes 134 penetrating in the thickness direction, the sacrifice layer 151 provided to the concave groove section 122 can easily be removed only by making the etching gas flow into through the communicating holes 134.

Further, the ultrasonic sensor 10 according to the present embodiment is provided with the ultrasonic transducers 100 and the receiver transducers 200 disposed on the sensor array substrate 11. Therefore, it is possible to receive the ultrasonic waves, which are output by the ultrasonic transducers 100, by the receiver transducers 200. Therefore, both of output and input of the ultrasonic wave can be performed by the same substrate, and therefore, reduction of the number of components and cost reduction in the PDA 1 can be achieved.

Further, the ultrasonic sensor 10 according to the present embodiment is provided with the ultrasonic transducers 100 and the receiver transducers 200 arranged on the sensor array substrate 11 to form a two-dimensional array structure. By arranging the ultrasonic transducers 100 in the two-dimensional array structure, it is possible to output the ultrasonic wave with high sound pressure toward a desired position. Further, by arranging the receiver transducers 200 in the two-dimensional array structure, it is possible to appropriately catch and receive the ultrasonic wave wherever on the sensor array substrate 11 the ultrasonic wave reflected by a finger or a pen of the user is input. Further, it is possible to easily figure out by calculation where the ultrasonic wave output by the ultrasonic transducer 100 is reflected based on the amplitude, the phase difference, and so on of the ultrasonic wave received.

Further, the ultrasonic transducers 100 according to the present embodiment are manufactured by performing the diaphragm stacking step, the concave groove forming step, the sacrifice layer embedding step, the piezoelectric member forming step, the communicating section forming step, the sacrifice layer removing step, and the substrate processing step as the support member forming step. Specifically, the ultrasonic transducers 100 are manufactured as follows. The concave groove sections 122 are provided to the diaphragms 120 on the sensor array substrate 11, and the sacrifice layer 151 is embedded in each of the concave groove sections 122. Subsequently, the piezoelectric members 130 provided with the communicating holes 134 are formed from above the diaphragms 120 and the sacrifice layer 151, and then the sacrifice layer 151 is removed through the communicating holes 134.

According to such a manufacturing method, the sacrifice layer 151 provided to the concave groove sections 122 can easily be removed only by making the etching gas flow into through the communicating holes 134 as described above, and thus the spaces 140 can be formed between the piezoelectric members 130 and the bottoms 123 of the concave groove sections 122. Further, it is also possible to prevent the deflection of the piezoelectric members 130 toward the concave groove sections 122.

Further, according to the present embodiment, in the ultrasonic sensor 10, both of the ultrasonic transducers 100 and the receiver transducers 200 can be formed simultaneously. Specifically, by forming the $SiO_2$ layer 120A and the $ZrO_2$ layer 120B on the sensor array substrate 11, the diaphragms 120 and the second diaphragms 220 can be formed simultaneously. Further, by forming the conductive film 152 for forming the lower electrodes of the piezoelectric members 130 and the second piezoelectric members 230, the PZT film 153, and the conductive film 154 for forming the upper electrodes thereof on the diaphragm opposed surface side of the sensor array substrate 11, and then performing etching by the ICP-RIE after forming the resist 150B, the piezoelectric members 130 and the second piezoelectric members 230 can be formed simultaneously. Further, by forming the resist on the output side surface 112 of the sensor array substrate 11 and then performing ICP etching thereon, the opening sections 113 and the second opening sections 213 can be formed simultaneously, and further, the support sections 110 and the second support sections 210 can be formed simultaneously. In other words, the diaphragm forming step and the second diaphragm forming step, the piezoelectric member forming step and the second piezoelectric member forming step, the support member forming step and the second support member forming step according to the invention can commonly be performed. According to such a manufacturing method, it is not required to separately provide manufacturing equipment for manufacturing the receiver transducers 200 to perform a separate manufacturing process, and it is possible to manufacture the receiver transducers 200 simultaneously with the manufacture of the ultrasonic transducers 100. Therefore, it is possible to make the manufacture of the ultrasonic sensor 10 easier, and reduction of the manufacturing cost can also be achieved.

Second Embodiment

Then, an ultrasonic sensor according to a second embodiment of the invention will be explained with reference to the accompanying drawings.

The ultrasonic sensor according to the second embodiment has a sensor array structure obtained by modifying the sensor array structure of the ultrasonic sensor 10 of the PDA 1 according to the first embodiment, and the specific configurations of the ultrasonic transducers 100 and the receiver transducers 200 as second ultrasonic transducers are the same. Therefore, the array structure of the ultrasonic sensor 10A according to the second embodiment will hereinafter be explained.

Figure 13A:
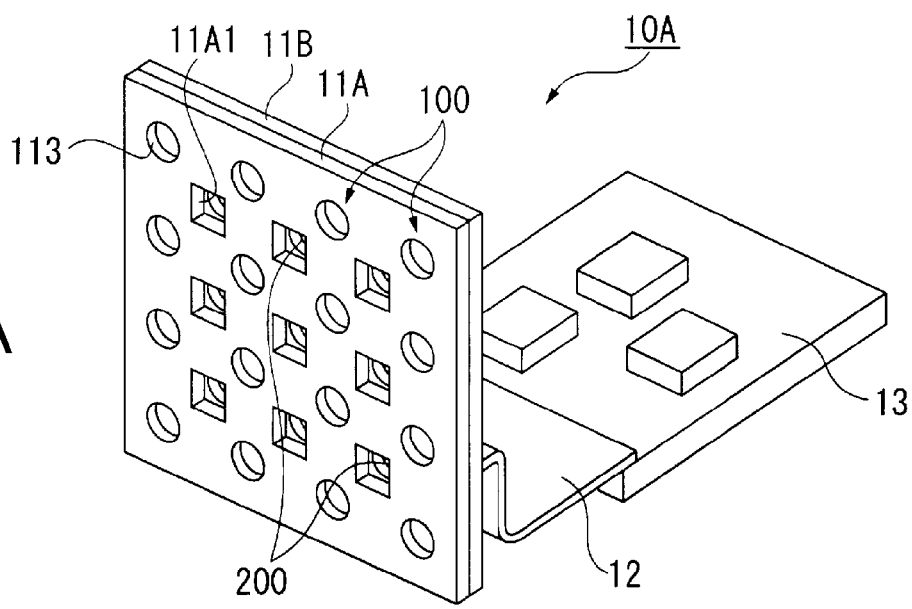

As shown in FIG. 13A, the ultrasonic sensor 10A according to the second embodiment is provided with two sensor array substrates, namely an ultrasonic wave transmitting sensor array substrate 11A, and an ultrasonic wave receiving sensor array substrate 11B.

Figure 13B:
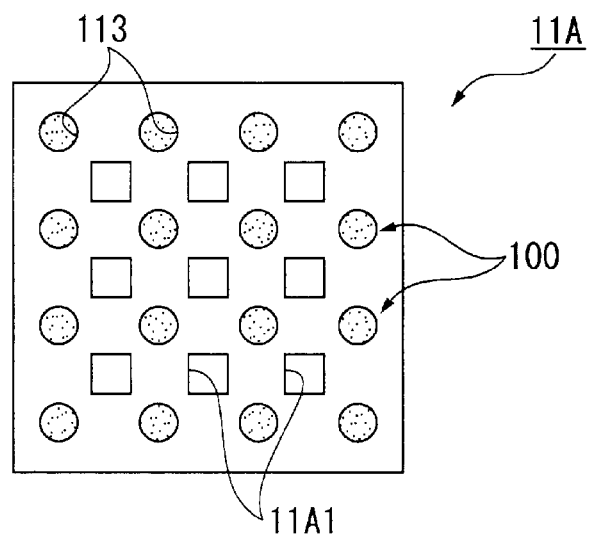

The ultrasonic wave transmitting sensor array substrate 11A is formed of, for example, a single crystal silicon substrate. As shown in FIG. 13B, the ultrasonic wave transmitting sensor array substrate 11A is provided with a plurality of ultrasonic transducers 100 arranged in a matrix at regular intervals. Here, the ultrasonic wave transmitting sensor array substrate 11A constitutes the support member according to the invention. Specifically, the ultrasonic wave transmitting sensor array substrate 11A is provided with the support sections 110 and the opening sections 113 disposed at positions where the ultrasonic transducers 100 are disposed.

Further, the ultrasonic wave transmitting sensor array substrate 11A is provided with through holes 11A1 arranged in a matrix at regular intervals. Specifically, the through holes 11A1 are provided to the ultrasonic wave transmitting sensor array substrate 11A in a zigzag manner with respect to the arrangement positions of the ultrasonic transducers 100.

Figure 13C:
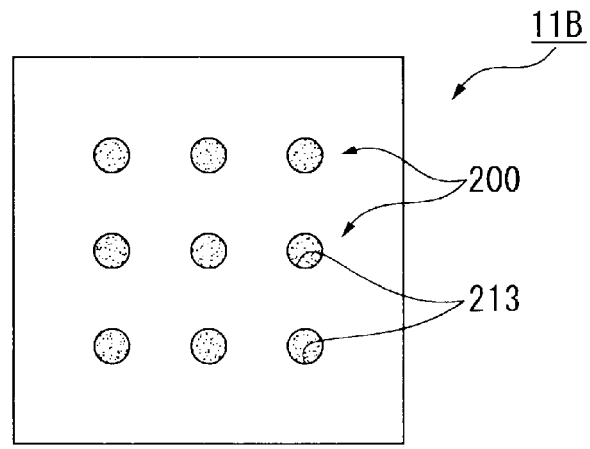

The ultrasonic wave receiving sensor array substrate 11B is formed of, for example, a single crystal silicon substrate. As shown in FIG. 13C, the ultrasonic wave receiving sensor array substrate 11B is provided with a plurality of receiver transducers 200 arranged in a matrix at regular intervals. More specifically, as shown in FIG. 13A, the receiver transducers 200 are arranged on the ultrasonic wave receiving sensor array substrate 11B so that the receiver transducers 200 of the ultrasonic wave receiving sensor array substrate 11B are exposed from the respective through holes 11A1 of the ultrasonic wave transmitting sensor array substrate 11A when overlapping the ultrasonic wave transmitting sensor array substrate 11A and the ultrasonic wave receiving sensor array substrate 11B with each other to form the ultrasonic sensor 10A.

Further, the ultrasonic wave receiving sensor array substrate 11B constitutes the second support member according to the invention. Specifically, the ultrasonic wave receiving sensor array substrate 11B is provided with the second support sections 210 and the second opening sections 213 disposed at positions where the receiver transducers 200 are disposed.

In such an ultrasonic sensor 10A according to the second embodiment, the ultrasonic wave transmitting sensor array substrate 11A and the ultrasonic wave receiving sensor array substrate 11B are respectively manufactured as separate members. Specifically, the ultrasonic wave transmitting sensor array substrate 11A provided with the ultrasonic transducers 100 is manufactured (a first manufacturing process) by the diaphragm forming step (the diaphragm stacking step, the concave groove forming step, the stacking step of the $ZrO_2$ layer 120B), the sacrifice layer embedding step, the piezoelectric member stacking step, the piezoelectric member forming step including the communicating section forming step, the sacrifice layer removing step, and the substrate processing step, following the steps shown in the left of FIGS. 8A through 12. Further, the ultrasonic wave receiving sensor array substrate 11B provided with the receiver transducers 200 is manufactured (a second manufacturing process) by the diaphragm forming step (the second diaphragm stacking step, the stacking step of the $ZrO_2$ layer 120B), the piezoelectric member stacking step, the second piezoelectric member forming step, and the substrate processing step, following the steps shown in the right of FIGS. 8A through 12. Further, by overlapping the ultrasonic wave transmitting sensor array substrate 11A and the ultrasonic wave receiving sensor array substrate 11B respectively manufactured in the first manufacturing process and the second manufacturing process with each other, and then bonding them to each other, the ultrasonic sensor 10A is manufactured.

Since the ultrasonic transducers 100 having the configuration substantially the same as that of the first embodiment are also provided to the ultrasonic sensor 10A of the second embodiment described above, the action and the advantages substantially the same as in the first embodiment described above can be obtained. Specifically, a large amount of deflection of the bottom 123 of the ultrasonic transducers 100 can be obtained, and the ultrasonic wave with high sound pressure can be output.

Further, in the ultrasonic sensor 10A according to the second embodiment, the ultrasonic wave transmitting sensor array substrate 11A and the ultrasonic wave receiving sensor array substrate 11B are respectively manufactured as separate members, and the ultrasonic sensor 10A is formed by overlapping these substrates with each other. Such a configuration can also be applied to the sensors using the ultrasonic wave transmitting sensor array substrate 11A or the ultrasonic wave receiving sensor array substrate 11B alone, for example.

Further, it is necessary for each of the substrates 11A, 11B to be provided with the wiring pattern for connecting the electrodes 132, 133, 232, 233 of the transducers 100, 200 and the arithmetic control section with each other. Here, in the case of providing the wiring pattern for the ultrasonic transducers 100 and the wiring pattern for the receiver transducers 200 to one sensor array substrate 11 as in the case of the first embodiment, the distance between the wiring patterns is small, and the manufacturing thereof might become difficult. In contrast, by separating the ultrasonic sensor 10A into the ultrasonic wave transmitting sensor array substrate 11A and the ultrasonic wave receiving sensor array substrate 11B as in the case of the second embodiment, the large distance between the wiring patterns provided to each of the substrates 11A, 11B can be realized, and it becomes easier to manufacture the ultrasonic sensor 10A.

Modified Example

It should be noted that the invention is not limited to the embodiments described above but includes modifications and improvements within a range where the advantages of the invention can be achieved.

For example, although in the embodiment described above, there is shown an example in which the piezoelectric member 130 is provided with the circular communicating holes 134 formed along the outer periphery of the concave groove section 122, the invention is not limited thereto, but the shapes shown in FIGS. 14A through 14D, for example, can also be adopted. It should be noted that FIGS. 14A through 14D, and FIGS. 15A through 15D, and 16 explained hereinafter show the constituents in a simplified manner, and illustrations of the $SiO_2$ layer 120A, the $ZrO_2$ layer 120B of the diaphragm 120, and illustrations of the piezoelectric film 131, the lower electrode 132, and the upper electrode 133 of the piezoelectric member 130 will be omitted.

Figure 14A:
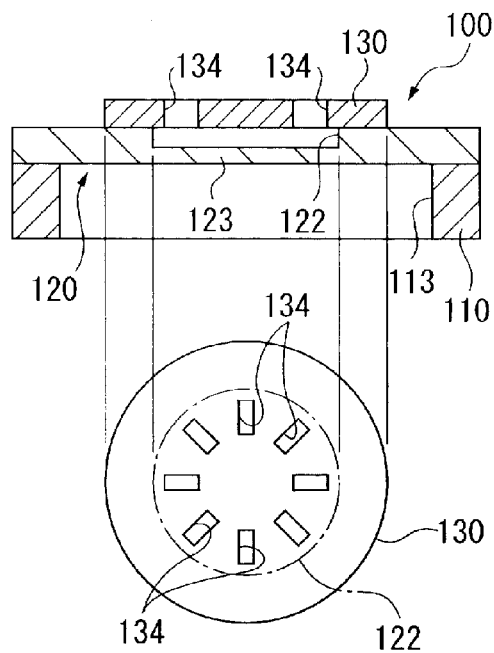
FIGS. 14A through 14D each include a cross-sectional view and a plan view of the ultrasonic transducer showing a modified example of a communicating hole of the piezoelectric member.
Figure 14B:
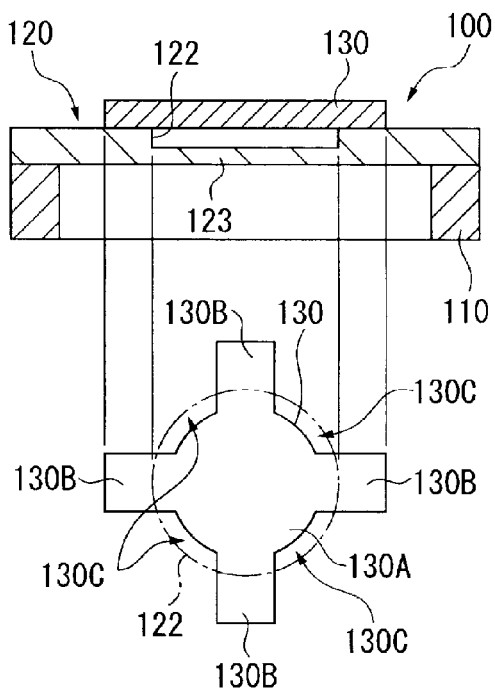
Figure 14C:
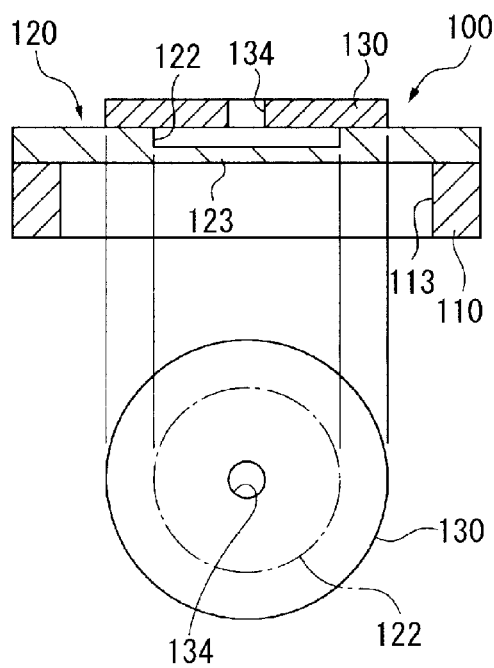
Figure 14D:
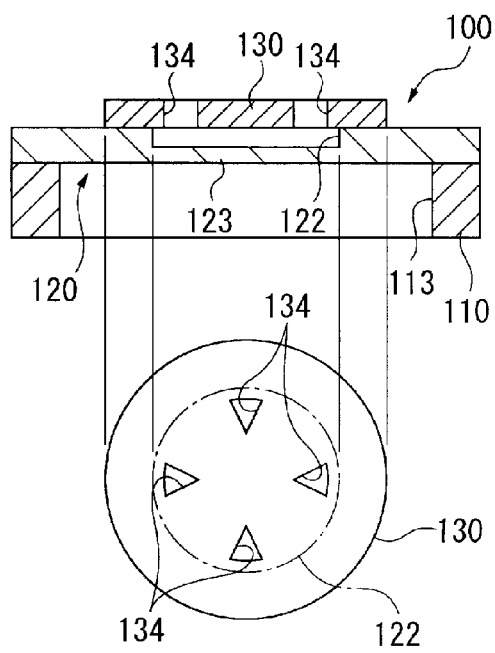

Specifically, as shown in FIGS. 14A through 14D, the shape of each of the communicating holes 134 can be a rectangular shape in the sensor plan view, and the rectangular communicating holes 134 can be arranged in a radial pattern as shown in FIG. 14A, or the fan-like communicating holes 134 can be arranged as shown in FIG. 14D.

Further, as shown in FIG. 14B, there can be adopted the configuration in which the piezoelectric member 130 is provided with a circular piezoelectric main body 130A smaller than the outer diameter dimension of the concave groove section 122, and a plurality of connecting sections 130B extending from the piezoelectric main body 130A toward the outer periphery, and the connecting sections 130B are fixed firmly to the outer peripheral area of the concave groove section 122 of the diaphragm 120. It should be noted that although FIG. 14B shows the four connecting sections 130B extending in directions perpendicular to each other, it is also possible to adopt the configuration in which three or less connecting sections 130B are arranged at intervals of, for example, 120 degrees, or the configuration in which five or more connecting sections 130B extend radially at regular angular intervals. In such configurations, spaces 130C are formed between the outer peripheral end of the piezoelectric main body 130A and the outer peripheral end of the concave groove section 122 in the areas between the connecting sections 130B, and the spaces 130C constitute the communicating sections according to the invention.

Further, regarding the positions at which the communicating holes 134 are formed, the invention is not limited to the configuration of being formed along the outer peripheral end of the concave groove section 122, but it is also possible to adopt the configuration of being formed at the central position of the piezoelectric member 130 as shown in FIG. 14C.

Figure 15A:
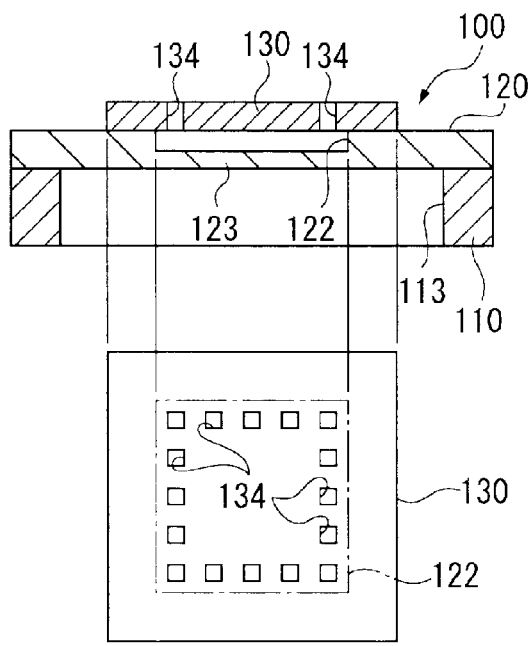
FIGS. 15A through 15D each include a cross-sectional view and a plan view of the ultrasonic transducer showing a modified example of a concave groove section.
Figure 15B:
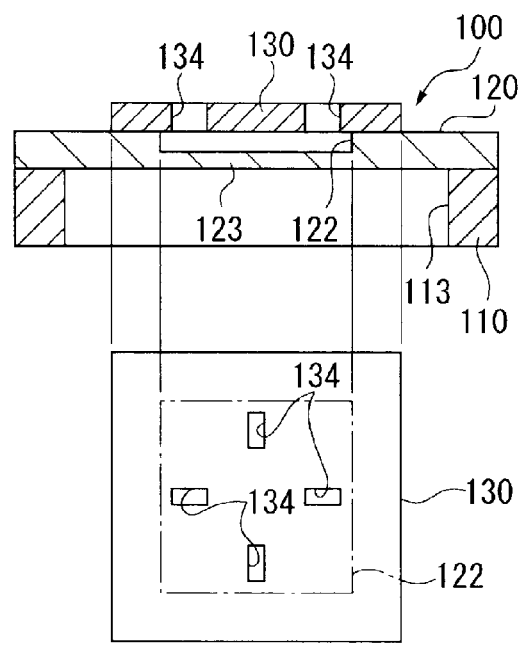
Figure 15C:
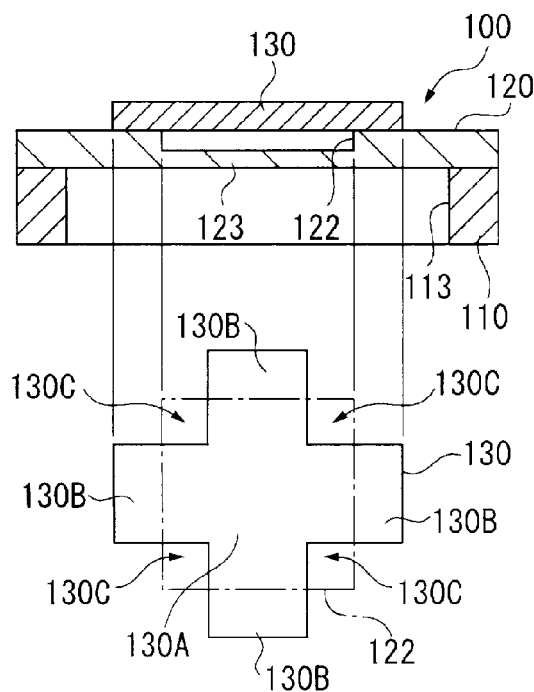
Figure 15D:
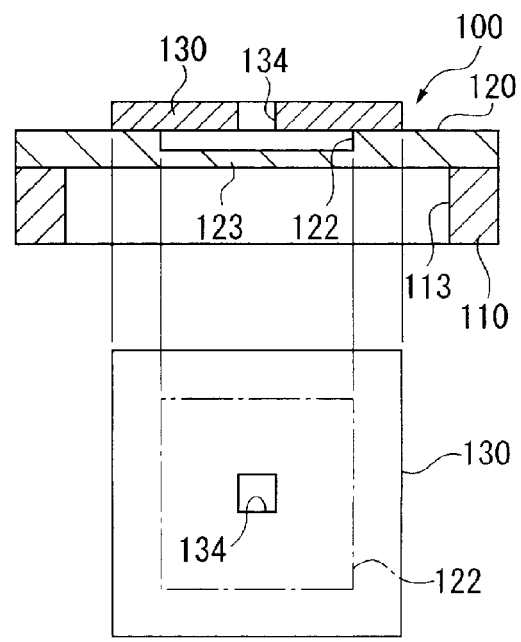

Further, the shape of the concave groove section 122 is not limited to the circular shape in the sensor plan view, but can take any shapes besides the circular shape. For example, as shown in FIGS. 15A through 15D, the configuration of being formed to have a square shape in the sensor plan view can also be adopted. In this case, the piezoelectric member 130 can also be formed to have a square shape in accordance with the shape of the concave groove section 122. Further, regarding the positions at which the communicating holes 134 are formed, the communicating holes 134 can be formed similarly to the embodiment described above or the examples shown in FIGS. 14A through 14D. Specifically, as shown in FIGS. 15A and 15B, the configuration in which the communicating holes 134 are formed along the outer peripheral end of the concave groove section 122 can also be adopted, and the shape of each of the communicating holes 134 can be a circular shape besides the square shape or the rectangular shape. Further, similarly to the case shown in FIG. 14B, it is possible to adopt the configuration in which the piezoelectric member 130 is provided with a piezoelectric main body 130A having the area smaller than the concave groove section 122 with the square shape, and connecting sections 130B extending from the piezoelectric main body 130A toward the outer periphery as shown in FIG. 15C, and in this case, the spaces 130C between the outer peripheral end of the piezoelectric main body 130A and the outer peripheral end of the concave groove section 122 can be used as the communicating sections as described above. Further, similarly to the case shown in FIG. 14C, the configuration of forming the communicating hole 134 at the central portion of the piezoelectric member 130 as shown in FIG. 15D can also be adopted.

Figure 16:
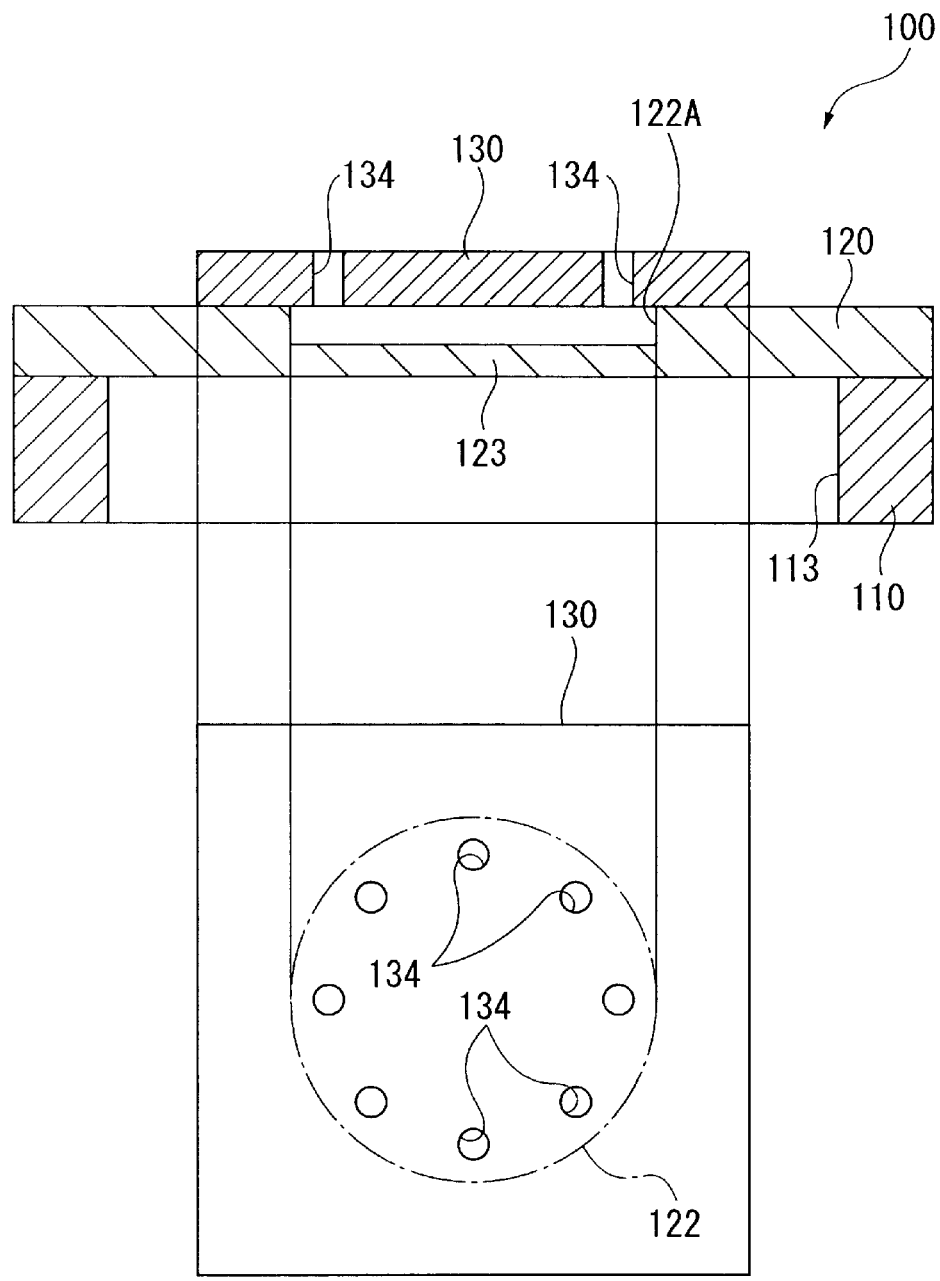
FIG. 16 includes a cross-sectional view and a plan view of the ultrasonic transducer showing a modified example of the shape of the piezoelectric member.

Further, it is also possible to adopt the configuration of providing the piezoelectric member 130 having a polygonal shape such as a square shape with respect to the concave groove section 122 having a circular shape as shown in FIG. 16, or the configuration of providing the piezoelectric member 130 having a circular shape with respect to the concave groove section 122 having a polygonal shape such as a square shape.

Further, although in the embodiment described above, the ultrasonic sensor 10 is manufactured by the manufacturing method capable of simultaneously manufacturing the ultrasonic transducers 100 and the receiver transducers 200, it is also possible to manufacture the ultrasonic transducers 100 and the receiver transducers 200 respectively in separate processes.

Further, as described above, it is also possible to manufacture the ultrasonic transducers 100 and the receiver transducers 200 on a predetermined substrate by the manufacturing method of the embodiment, then cut the ultrasonic transducers 100 and the receiver transducers 200 into pieces by laser cut, and then use them as discrete transducers. Also in such a case, the ultrasonic transducers 100 and the receiver transducers 200 can be manufactured simultaneously to thereby improve the manufacturing efficiency, and at the same time, in the case in which the array arrangement positions of each of the transducers 100, 200 need to be changed on the sensor array substrate 11, for example, the transducers 100, 200 can arbitrarily be detached, which makes it possible to achieve expansion of use.

Further, although in the embodiment, the receiver transducers 200 are disposed on the sensor array substrate 11 as the sensor elements for receiving the ultrasonic wave bounced back, it is also possible to make the receiver transducers 200 output ultrasonic waves by applying voltages to them. On this occasion, it is possible to make the ultrasonic wave output by the ultrasonic transducers 100 and the ultrasonic wave output by the receiver transducers 200 different in sound pressure from each other to thereby use the ultrasonic waves for different purposes.

Figure 17:
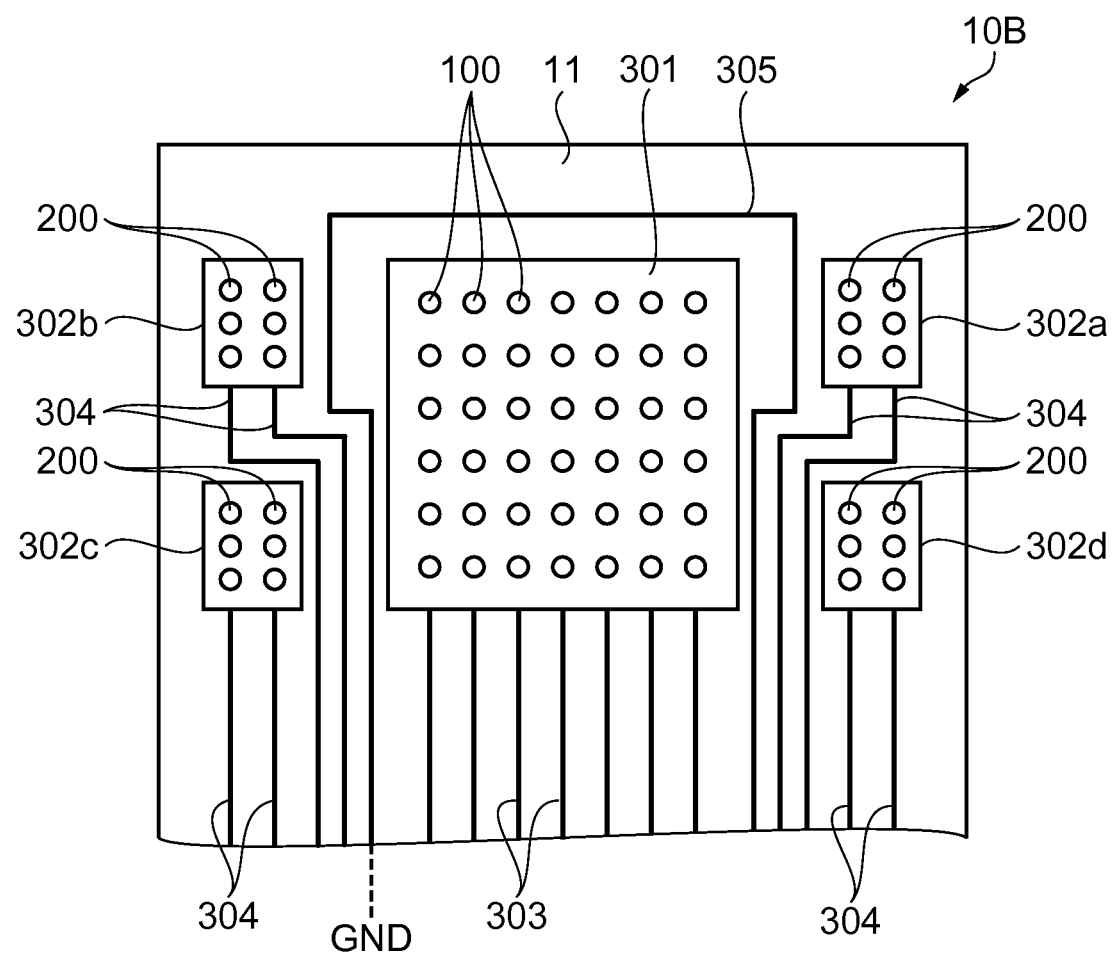
FIG. 17 is a schematic plan view showing a modified example of the configuration of the ultrasonic sensor.
Figure 18:
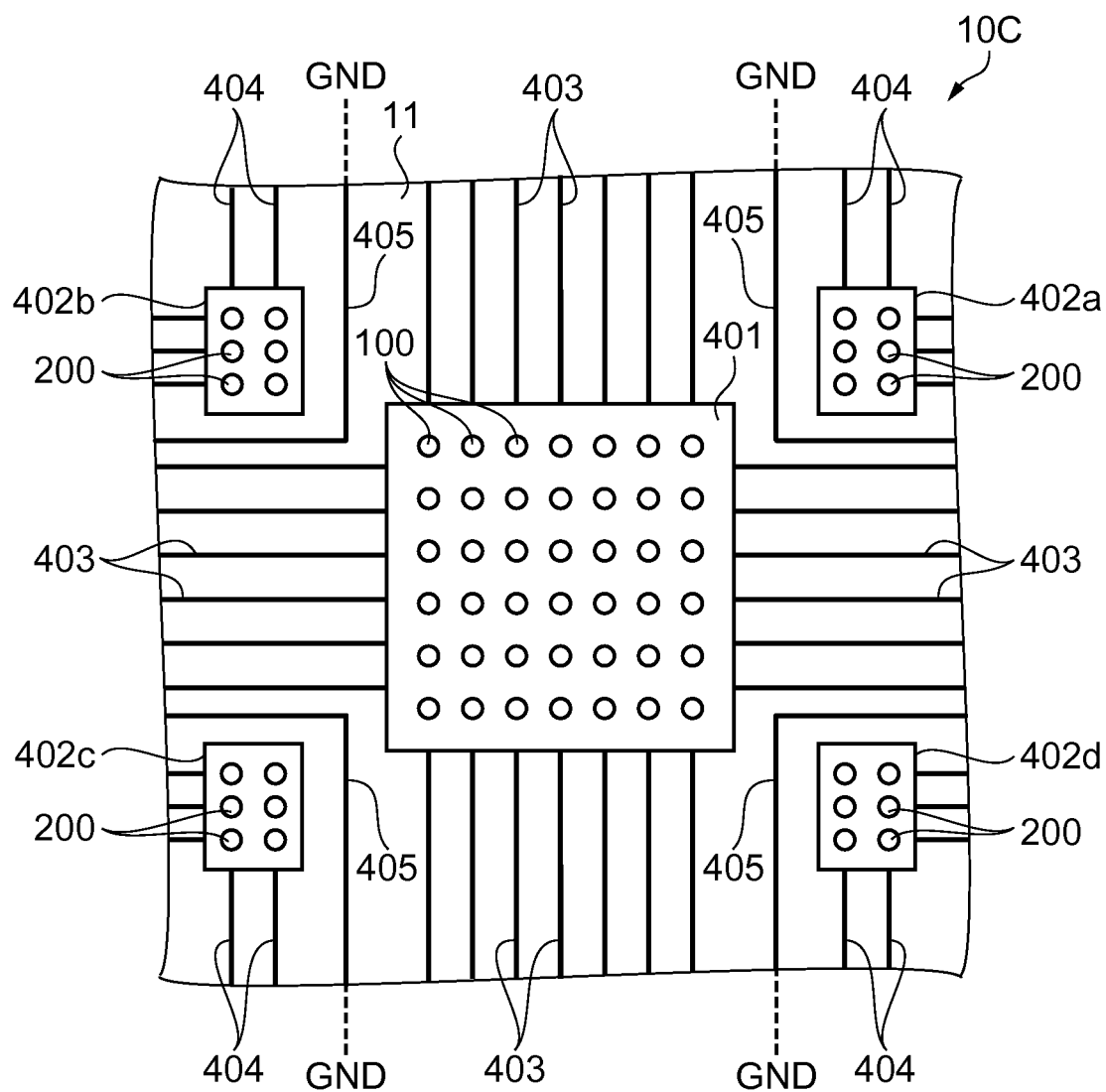
FIG. 18 is a schematic plan view showing a modified example of the configuration of the ultrasonic sensor.

Further, although in the embodiment described above, the positional relationship between the ultrasonic transducers 100 and the receiver transducers 200 is set to the zigzag arrangement or the concentric arrangement, it is also possible to dispose a transmitting array having a plurality of ultrasonic transducers in a substantially central area of the sensor array substrate 11, and dispose receiving arrays each having a plurality of receiver transducers in at least three areas (e.g., four areas) in the periphery of the central area as shown in FIGS. 17 and 18. FIGS. 17 and 18 are schematic plan views each showing a modified example of the configuration of the ultrasonic sensor.

Firstly, the structure of the ultrasonic sensor 10B shown in FIG. 17 will be explained. The ultrasonic sensor 10B has a transmitting array 301 disposed in roughly central area of the sensor array substrate 11. Further, receiving arrays 302 (a first receiving array 302a, a second receiving array 302b, a third receiving array 302c, and a fourth receiving array 302d) are disposed in four directions in the periphery of the central area.

The transmitting array 301 is provided with a plurality of ultrasonic transducers 100 disposed in a matrix. Each of the receiving arrays 302a, 302b, 302c, 302d is provided with a plurality of receiver transducers 200 disposed in a matrix.

The ultrasonic transducers 100 provided to the transmitting array 301 are electrically connected to transmission drive electrode lines 303 connected to an external control circuit not shown. Further, the receiver transducers 200 provided to each of the receiving arrays 302a, 302b, 302c, 302d are also connected to reception detection electrode lines 304 connected to the external control circuit not shown. The plurality of transmission drive electrode lines 303 and the plurality of reception detection electrode lines 304 extend so that one ends thereof are collected on one side of the sensor array substrate 11.

Further, a constant potential wiring 305 having one end connected to the GND is disposed between the receiving arrays 302a, 302d and the transmitting array 301, and between the receiving arrays 302b, 302c and the transmitting array 301. In other words, the transmitting array 301 and the receiving arrays 302 are arranged across the constant potential wiring 305.

Thus, an electrical noise can be prevented from occurring between the ultrasonic transducers 100 provided to the transmitting array 301 and the receiver transducers 200 provided to the receiving arrays 302. Specifically, the electrical noise generated when the ultrasonic transducers 100 transmit the ultrasonic wave can be eliminated by the constant potential wiring 305. In addition, since the constant potential wiring 305 is provided, it is possible to prevent the vibration noise from transmitting to the receiver transducers 200.

Then, the structure of the ultrasonic sensor 10C shown in FIG. 18 will be explained. The ultrasonic sensor 10C has a transmitting array 401 disposed in roughly central area of the sensor array substrate 11 similarly to the ultrasonic sensor 10B shown in FIG. 17. Further, receiving arrays 402 (a first receiving array 402a, a second receiving array 402b, a third receiving array 402c, and a fourth receiving array 402d) are disposed in four directions in the periphery of the central area.

Similarly to the ultrasonic sensor 10B shown in FIG. 17, the transmitting array 401 is provided with a plurality of ultrasonic transducers 100 disposed in a matrix. Each of the receiving arrays 402a, 402b, 402c, 402d is provided with a plurality of receiver transducers 200 disposed in a matrix.

The ultrasonic transducers 100 provided to the transmitting array 401 are electrically connected to transmitting drive electrode lines 403 connected to an external control circuit not shown. Further, the receiver transducers 200 provided to each of the receiving arrays 402a, 402b, 402c, 402d are also connected to reception detection electrode lines 404 connected to the external control circuit not shown.

The transmission drive electrode lines 403 extend from four sides constituting the transmitting array 401 in the directions roughly perpendicular to the respective sides. The reception detection electrode lines 404 extend from two sides out of the four sides constituting the receiving array 402 in the directions roughly perpendicular to the respective sides.

It should be noted that similarly to the ultrasonic sensor 10B shown in FIG. 17, constant potential wirings 405 each having one end connected to the GND are respectively disposed between the receiving arrays 402a, 402b, 402c, 402d and the transmitting array 401.

Further, the invention is not limited to the configuration of disposing the transmitting array 301, 401 and the receiving arrays 302, 402 on the sensor array substrate 11 (a common substrate) as in the case of the ultrasonic sensor 10B shown in FIG. 17 and the case of the ultrasonic sensor 10C shown in FIG. 18, but it is also possible to form the transmitting array 301, 401 and the receiving arrays 302, 402 respectively in separate substrates, and use these substrates in combination.

Besides the above, specific structures and procedures to be adopted when putting the invention into practice can arbitrarily be modified to other structures and so on within the range in which the advantage of the invention can be achieved.

The entire disclosure of Japanese Patent Application Nos. 2009-260679, filed Nov. 16, 2009 and 2010-182113, filed Aug. 17, 2010 are expressly incorporated by reference herein.

What is claimed is:

1. An ultrasonic transducer comprising:
a support member that has an opening;
a diaphragm supported by the support member, the diaphragm having a first surface and a second surface opposite to the first surface, the first surface having a concavity, the second surface covering the opening; and
a piezoelectric member covering the concavity of the diaphragm so as to have an air gap therebetween, wherein
the second surface of the diaphragm is exposed to the opening,
the piezoelectric member is fixed to the first surface of the diaphragm at a periphery of the concavity, and
when electric power is applied to the piezoelectric member, the concavity of the diaphragm expands toward the opening.

2. The ultrasonic transducer according to 1, wherein
the piezoelectric member has at least one communicating section adapted to perform air communication between the air gap and an external area.

3. An ultrasonic sensor comprising:
at least one ultrasonic transducer according to claim 1; and
at least one second ultrasonic transducer each including
a second support member having a second opening section,
a second diaphragm adapted to cover the second opening section, and
a second piezoelectric member stacked on the second diaphragm, and adapted to convert a displacement of the second diaphragm into an electrical signal, and output the electrical signal.

4. The ultrasonic sensor according to claim 3, wherein
a plurality of the ultrasonic transducers and a plurality of the second ultrasonic transducers are arranged in a two-dimensional array structure.

5. The ultrasonic sensor according to claim 4, wherein
the ultrasonic transducers are disposed in a central area of the two-dimensional array structure,
the second ultrasonic transducers are disposed in three or more areas in a periphery of the central area, and
a constant potential wiring connected to a constant potential is disposed between the ultrasonic transducers and the second ultrasonic transducers.

6. The ultrasonic sensor according to claim 3, further comprising:
a sensor array substrate constituting the support member of the at least one ultrasonic transducer, and the second support member of the at least one second ultrasonic transducer.

* * * * *